(12) United States Patent
Eldesouki et al.

(10) Patent No.: US 8,716,643 B2
(45) Date of Patent: May 6, 2014

(54) SINGLE PHOTON COUNTING IMAGE SENSOR AND METHOD

(75) Inventors: Munir Eldesouki, Hamilton (CA); Mohamed Jamal Deen, Dundas (CA); Qiyin Fang, Grimsby (CA)

(73) Assignee: King Abdulaziz City Science and Technology, Riyadh (SA)

( * ) Notice: Subject to any disclaimer, the term of this patent is extended or adjusted under 35 U.S.C. 154(b) by 912 days.

(21) Appl. No.: 12/876,185

(22) Filed: Sep. 6, 2010

(65) Prior Publication Data

US 2012/0057059 A1    Mar. 8, 2012

(51) Int. Cl.
*H01L 27/00* (2006.01)
*H04N 5/335* (2011.01)

(52) U.S. Cl.
USPC .............. 250/208.1; 348/302; 348/216.1

(58) Field of Classification Search
USPC ............ 250/208.1, 214 A, 214 R; 348/216.1, 348/294, 297, 300, 301, 302, 308
See application file for complete search history.

(56) References Cited

U.S. PATENT DOCUMENTS

| | | | | |
|---|---|---|---|---|
| 4,710,817 A * | 12/1987 | Ando | | 348/310 |
| 5,468,954 A * | 11/1995 | Furukawa | | 250/208.1 |
| 5,565,915 A * | 10/1996 | Kindo et al. | | 348/308 |
| 5,650,643 A * | 7/1997 | Konuma | | 257/225 |
| 5,665,959 A * | 9/1997 | Fossum et al. | | 250/208.1 |
| 6,248,990 B1 * | 6/2001 | Pyyhtia et al. | | 250/208.1 |
| 6,330,030 B1 * | 12/2001 | O'Connor | | 348/297 |
| 6,587,145 B1 * | 7/2003 | Hou | | 348/297 |
| 6,873,282 B1 * | 3/2005 | Murphy | | 341/164 |
| 7,115,963 B2 * | 10/2006 | Augusto et al. | | 257/440 |
| 7,262,402 B2 * | 8/2007 | Niclass et al. | | 250/214.1 |
| 7,319,423 B2 * | 1/2008 | Augusto et al. | | 341/155 |
| 7,547,872 B2 * | 6/2009 | Niclass et al. | | 250/214 R |
| 7,598,998 B2 * | 10/2009 | Cernasov et al. | | 348/362 |
| 7,623,173 B2 * | 11/2009 | Nitta et al. | | 348/302 |
| 7,795,650 B2 * | 9/2010 | Eminoglu et al. | | 257/228 |
| 7,858,917 B2 * | 12/2010 | Stern et al. | | 250/214 R |
| 7,868,665 B2 * | 1/2011 | Tumer et al. | | 327/70 |
| 7,911,520 B2 * | 3/2011 | Shigematsu et al. | | 348/300 |
| 7,940,317 B2 * | 5/2011 | Baxter | | 348/302 |
| 8,026,471 B2 * | 9/2011 | Itzler | | 250/214.1 |
| 8,338,773 B2 * | 12/2012 | Eldesouki et al. | | 250/214 A |
| 8,426,797 B2 * | 4/2013 | Aull et al. | | 250/214 R |
| 8,471,750 B2 * | 6/2013 | Rogers et al. | | 341/155 |
| 8,488,034 B2 * | 7/2013 | Nishihara | | 348/297 |
| 2006/0131480 A1 * | 6/2006 | Charbon et al. | | 250/214.1 |
| 2006/0131484 A1 * | 6/2006 | Peting | | 250/214 R |
| 2010/0181491 A1 * | 7/2010 | Karim et al. | | 250/394 |
| 2010/0213353 A1 * | 8/2010 | Dierickx | | 250/214 R |
| 2011/0017918 A1 * | 1/2011 | Baeumer et al. | | 250/370.11 |

(Continued)

*Primary Examiner* — John Lee
(74) *Attorney, Agent, or Firm* — Raj Abhyanker, P.C.

(57) ABSTRACT

A single photon counting image sensor and method is provided. In one aspect, the method of an image sensor includes counting through a counter circuit a number of photons detected through a photodiode when a light is incident on the photodiode. The method also includes storing in a memory circuit a time count of the number of photons take to match a reference count of the number of photons. In another aspect, an image sensor device includes a pixel circuit. The image sensor device also includes a photodiode circuit of the pixel circuit to detect photons when a light is incident on the photodiode circuit. The image sensor device further includes a counter circuit of the pixel circuit coupled to the photodiode circuit to count a number of photons detected when a light is incident on the avalanche photo diode.

20 Claims, 32 Drawing Sheets

(56) References Cited

U.S. PATENT DOCUMENTS

| | | | |
|---|---|---|---|
| 2011/0249148 A1* | 10/2011 | Prescher et al. | 348/234 |
| 2012/0056078 A1* | 3/2012 | Eldesouki et al. | 250/214 DC |
| 2012/0057059 A1* | 3/2012 | Eldesouki et al. | 348/302 |
| 2012/0057152 A1* | 3/2012 | Eldesouki et al. | 356/226 |
| 2012/0091324 A1* | 4/2012 | Grund | 250/214 R |
| 2012/0138774 A1* | 6/2012 | Kelly et al. | 250/208.1 |
| 2013/0068928 A1* | 3/2013 | Eldesouki et al. | 250/206 |
| 2013/0168535 A1* | 7/2013 | Eldesouki | 250/214.1 |

* cited by examiner

SINGLE PHOTON COUNTING IMAGE SENSOR AND METHOD

FIELD OF TECHNOLOGY

Embodiments of the disclosure relate generally to the field of image sensing and, more particularly, to single photon counting image sensor and method.

BACKGROUND

Images may be captured through an image sensor device. An image captured under a low light condition may have low signal to noise ratio. Improving the signal to noise ratio of the image captured under low light condition may require a long exposure time and/or a high sensitivity. The long exposure time and/or high sensitivity requirements may limit an increase in a dynamic range of the image captured through the image sensor device. The long exposure time may also prevent an increase of a speed of operation of the image sensor device. A time domain imaging technique may increase a dynamic range of the image sensor device. However, obtaining the high dynamic range through the time domain imagine technique may decrease the speed of operation of the image sensor device in low light conditions.

Under the low light conditions the image sensor device may take a long time to obtain a high dynamic range image. The long time to obtain a high dynamic range image may further prevent an increment of the speed of operation of the image sensor device. Consequently, the image sensor device may not produce an image having a high dynamic range and a high sensitivity at high speeds in one capture operation of the image sensor device. Further, the image sensor device may not perform efficiently in low light level applications. For example, the image sensor may not be used for night shots, military and surveillance imagers, quantum computing, and biomedical imaging such as chemiluminescence, auto-fluorescence, and fluorescence lifetime imaging.

SUMMARY

Disclosed is single photon counting image sensor and method.

In one aspect, the method of an image sensor includes counting through a counter circuit a number of photons detected through a photodiode when a light is incident on the photodiode. The method also includes storing in a memory circuit a time a count of the number of photons take to match a reference count of the number of photons. The method further includes measuring an intensity of a light through the image sensor based on the time the count of the number of photons take to match the reference count of the number of photons.

The method may further include determining through a comparator circuit of the counter circuit when a count of the number of photons detected matches the reference count of the number of photons. The method may furthermore include selecting the reference count of number of photons through a threshold selection circuit. The method may furthermore include changing the reference count of number of photons dynamically based on an output of the threshold selection circuit through controlling a threshold multiplexer circuit to increase at least one of a dynamic range of the image sensor and a speed of operation of the image sensor. The method may furthermore include implementing the image sensor in a deep submicron semiconductor technology.

The method may furthermore include increasing a dynamic range of the image sensor, a sensitivity of the image sensor and/or a speed of operation of the image sensor through measuring the intensity of light based on the time the count of the number of photons take to match the reference count of the number of photons.

The counter circuit may be internal to a pixel circuit of the image sensor to maximize the speed of operation of the image sensor. The memory circuit may be an n-bit volatile memory. The 'n' may be determined based on an application of the image sensor, and the output of the image sensor may be an image.

The photodiode may be an avalanche photodiode. The avalanche photodiode may operate in a Geiger mode. The avalanche photodiode may be coupled to a low dead time active quench and reset circuit. A count of time stored in the memory circuit may be provided through a clock circuit. The clock circuit may be a separate counter circuit from the counter circuit inside the pixel. The separate counter circuit may be external to the pixel circuit and is triggered through an external clock signal.

A speed of operation of the image sensor may be increased through counting the number of photons detected through the photodiode inside the pixel circuit of the image sensor. Further, a high dynamic range and high sensitivity output may be generated at a high speed of operation in a single capture operation of the image sensor through measuring the intensity of light based on the time the count of the number of incident photons take to reach the reference count of the number of photons.

The method may further include operating the image sensor at high frame rate of the image sensor while maintaining a high dynamic range through increasing a pixel rate of the image sensor. The method may furthermore include reducing a time taken to measure a low intensity light incident on the photodiode through changing the reference count of number of photons dynamically.

The method may furthermore include stopping a count of the number of photons detected through the counter circuit when a maximum threshold time is reached if the maximum threshold time is reached before all the pixel circuit of the image sensor has finished storing in the memory circuit the time the count of the number of photons take to match the reference count of the number of photons.

In another aspect, an image sensor device includes a pixel circuit. The image sensor device also includes a photodiode circuit of the pixel circuit to detect photons when a light is incident on the photodiode circuit. The image sensor device further includes a counter circuit of the pixel circuit coupled to the photodiode circuit to count a number of photons detected when a light is incident on the avalanche photo diode. The image sensor device furthermore includes a memory circuit of the pixel circuit coupled to the counter circuit to store a time a count of the number of photons take to match a reference count of the number of photons. The image sensor device furthermore includes a threshold multiplexer circuit of the pixel circuit to change the reference count of number of photons dynamically based on an output of a threshold selection circuit.

The image sensor device may include a comparator circuit of the counter circuit to determine when, a count of the number of photons detected matches the reference count of the number of photons. The image sensor device may also include a timer circuit of the image sensor device to provide a count of time to the memory circuit proportional to the time the count of the number of photons detected takes to match a reference count of number of photons.

The photodiode circuit, the counter circuit and the memory circuit may be internal to the pixel circuit. The photodiode circuit, the counter circuit and the memory circuit may operate in concert to generate a high dynamic range and high sensitivity output at a high speed of operation in a single capture operation of the image sensor device through measuring an intensity of light based on the time the count of the number of photons take to match the reference count of the number of photons.

The threshold selection circuit may select a reference count of number of photons. The timer circuit may be a separate counter circuit. The separate counter circuit may be external to the pixel circuit. The separate counter circuit may be triggered through an external clock signal. The timer circuit to provide the count of time to each pixel circuit in a pixel circuit array of the image sensor device.

In yet another aspect, a camera on chip system, includes an image source. The camera on chip system also includes an array of pixel circuit to capture an image of the image source. The camera on chip system further includes a photodiode circuit inside each pixel circuit of the array of pixel circuit to detect photons when a light is incident on the photodiode circuit. The camera on chip system furthermore includes a counter circuit of each pixel circuit of the array of pixel circuit, coupled to the photodiode circuit to count a number of photons detected when a light is incident on the avalanche photo diode. The camera on chip system furthermore includes a memory circuit of each pixel circuit of the array of pixel circuit, coupled to the counter circuit to store a time a count of the number of photons take to match a reference count of the number of photons.

The camera on chip system may include a threshold multiplexer circuit of each pixel circuit of the array of pixel circuit to change the reference count of number of photons dynamically based on an output of a threshold selection circuit. The camera on chip system may further include a comparator circuit of the counter circuit to determine when, a count of the number of photons detected matches the reference count of the number of photons. The camera on chip system may furthermore include a timer circuit of the camera on chip system to provide a count of time to the memory circuit proportional to the time the count of the number of photons detected takes to match a reference count of number of photons.

The photodiode circuit, the counter circuit and the memory circuit may be internal to the pixel circuit. The photodiode circuit, the counter circuit and the memory circuit may operate in concert to generate a high dynamic range and high sensitivity output at a high speed of operation in a single capture operation of the image sensor device through measuring an intensity of light based on the time the count of the number of photons take to match the reference count of the number of photons. The threshold selection circuit may select a reference count of number of photons. The timer circuit may be a separate counter circuit. The separate counter circuit may be external to the pixel circuit. The separate counter circuit may be triggered through an external clock signal. The timer circuit may provide the count of time to each pixel circuit in a pixel circuit array of the image sensor device.

The counter circuit may be internal to a pixel circuit of the image sensor to maximize the speed of operation of the image sensor. The memory circuit may include an n-bit volatile memory. The 'n' may be determined based on an application of the camera on chip system. The photodiode may include an avalanche photodiode. The avalanche photodiode may operate in a Geiger mode. The avalanche photodiode may be coupled to a low dead time active quench and reset circuit.

The methods, systems, and apparatuses disclosed herein may be implemented in any means for achieving various aspects, and may be executed in a form of a machine-readable medium embodying a set of instructions that, when executed by a machine, causes the machine to perform any of the operations disclosed herein. Other features will be apparent from the accompanying drawings and from the detailed description that follows.

BRIEF DESCRIPTION OF THE VIEWS OF DRAWINGS

Example embodiments are illustrated by way of example and not limitation in the figures of the accompanying drawings, in which like references indicate similar elements and in which.

Figure 1:
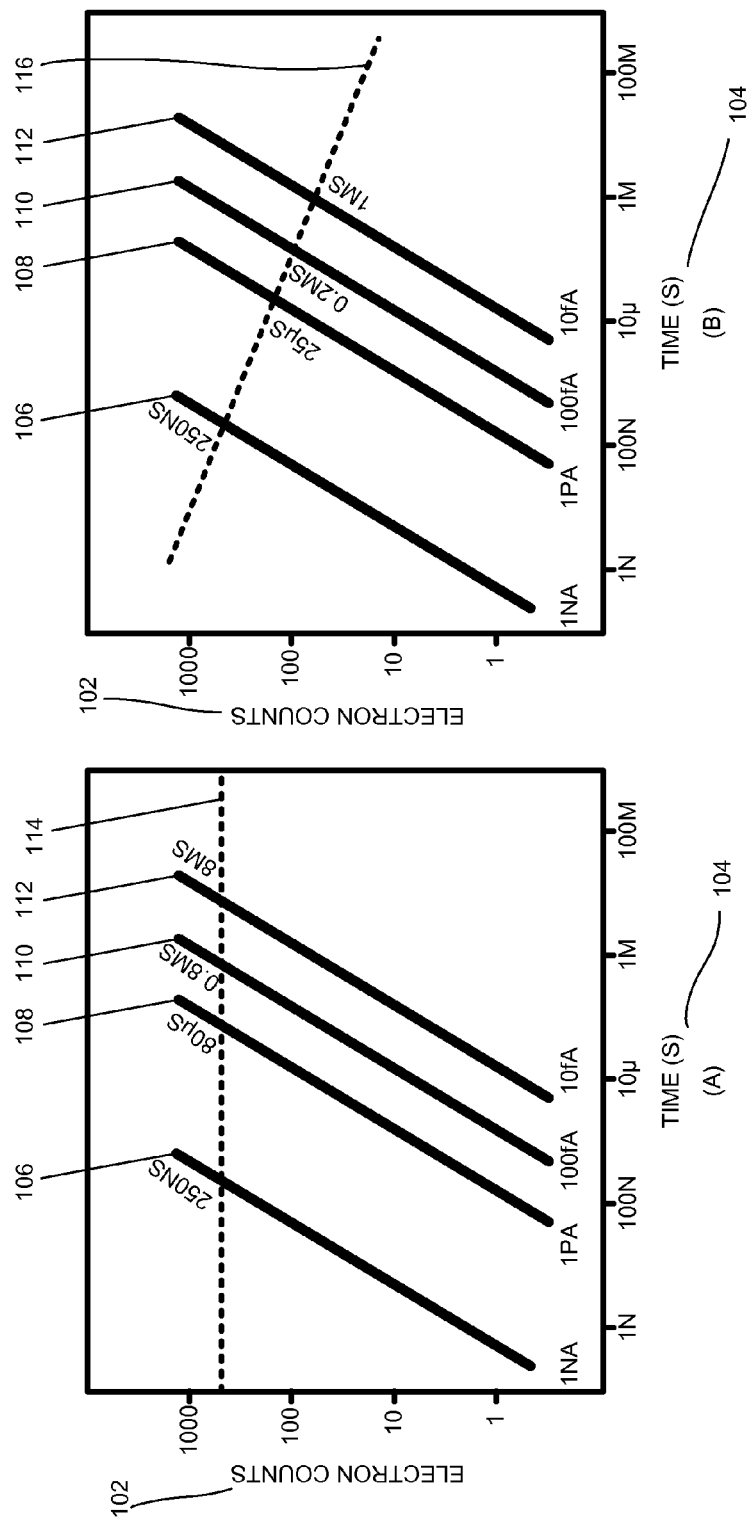
FIGS. 1A-1B illustrate the time domain imaging technique through single photon counting to measure a light intensity when a constant reference and a variable reference count is used.

Other features of the present embodiments will be apparent from the accompanying drawings and from the detailed description that follows.

DETAILED DESCRIPTION

Disclosed is single photon counting image sensor and method. Although the present embodiments have been described with reference to specific example embodiments, it will be evident that various modifications and changes may be made to these embodiments without departing from the broader spirit and scope of the various embodiments.

Time domain imaging technique may measure an intensity of light through comparing when an output voltage of a photodiode proportional to an intensity of light incident on the photodiode matches a reference voltage. Time domain imaging may be implemented to enhance a dynamic range of an image detector. The image detector may be an active pixel sensor (APS). The APS may include a photodiode. A time required for the output voltage of the photodiode to drop below the reference voltage may determine an intensity of the light. A high intensity light may have a shorter time than a low intensity light, and the dynamic range may be measured as the ratio of maximum time to the minimum time.

In accordance with one or more embodiments, an image sensor device disclosed herein may be configured to perform the time domain imaging technique through a single photon counting to measure an intensity of light. In one or more embodiments, performing the time domain imaging technique through the single photon counting may generate a high speed, a high dynamic range and a high sensitivity output in a single capture operation of the image sensor device. The single photon counting through the time domain imaging technique may include counting through a counter circuit a number of photons detected through a photodiode when a light is incident on the photodiode. In one or more embodiments, the image sensor device may be a complementary metal oxide semiconductor (CMOS) single photon counting imager system. In one or more embodiments, a time taken, by a count of the number of photons, to match a reference count of the number of photons may be stored in a memory circuit. In one or more embodiments, an intensity of a light may be measured through the image sensor based on the time taken by the count of the number of photons to match the reference count of the number of photons.

In an example embodiment, the image sensor device disclosed herein may be configured to count a number of electrons released by the photodiode circuit when a light is incident on the active portion of the photodiode circuit. In an example embodiment, the intensity of a light may be measured through the image sensor device disclosed here in based on the time taken by the count of the number of electrons to match a reference number of electrons. In one or more embodiments, the number of electrons released by the photodiode circuit when the light is incident on the active portion of the photodiode may be proportional to the number of photons of the light incident on the active portion of the photodiode circuit. The count of the number of electrons may indirectly correspond to counting the number of photons incident on the photodiode circuit. In an example embodiment, the count of the number electrons may be compared to a reference number of electrons. In one or more embodiments, the reference number of electrons may correspond to a minimum number of electrons sufficient to enable an earliest detection of a light of specific intensity. The time taken for the count of number of electrons generated by the photodiode circuit to reach the reference number of electrons may determine an intensity of light. In one or more embodiments, a light of high intensity may be detected faster than a light of low intensity. In one or more embodiments, a weak optical signal may take longer to be detected than a stronger optical signal. In one or more embodiments, the strong optical signal may have larger number of photons incident on the photodiode per unit time. In one or more embodiments, the count of the number of electrons may reach the reference number of electrons faster for a strong optical signal.

FIGS. 1A-1B illustrate the time domain imaging technique through single photon counting to measure a light intensity when a constant reference and a variable reference count is used. In particular, FIGS. 1A-1B illustrate an electron count equivalent of a calculated output voltage of an active pixel sensor for four different optical powers (e.g. optical powers corresponding to incident light intensity of 1 nA, 1 pA, 100 fA, and 10 fA) and the time the electron counts take to reach the reference electron counts.

In one or more embodiments, FIG. 1A particularly illustrates the electron count equivalent of the output voltage of the APS being compared to a constant reference electron count. In one or more embodiments, FIG. 1A may be a graph based representation of light intensity measurement through time domain imaging technique using single photon counting. In one or more embodiments, the horizontal axis of the graph illustrated in FIG. 1A may represent a time 104 in seconds. In one or more embodiments, the vertical axis of the graph illustrated in FIG. 1A may represent a count of electrons. The count of electrons may be also termed as electron counts 102. In an example embodiment, the graph 106, graph 108, graph 110 and graph 112 may represent the electron count equivalent of a calculated output voltage of the active pixel sensor for an incident light of optical power of 1 nA, 1 pA, 100 fA, 10 fA. In one or more embodiments, the line 114 may represent the constant reference electron count. In an example embodiment illustrated herein, the constant reference electron count may be 512 electrons. In one or more embodiments, comparing a count of a number of electrons to a reference electron count in time domain imaging technique may increase a speed of operation and a sensitivity of the image sensor device.

In an example embodiment, for a light of intensity 1 nA as illustrated in FIG. 1A, a time of 250 ns may be taken to reach a reference count of 512 electrons. In an example embodiment, the 512 photons detected by the APS in 250 ns may correspond to an equivalent voltage drop of 1.6 mV. In one or more embodiments, measuring a voltage drop of 1.6 mV accurately may require complex in pixel circuitry, which may decrease a resolution of an output of the image sensor device and may reduce a speed of operation of the image sensor device. The time domain imaging technique through single photon counting disclosed herein may allow a detection of a minute voltage drop (e.g. 1.6 mV) through a simple in pixel circuitry illustrated in FIG. 2. In an example embodiment as illustrated in FIG. 1A, for a light of intensity 10 fA, a time of 8 ms may be taken to reach a reference count of 512 electrons. In an example embodiment, based on the values of time taken to reach reference electron count in FIG. 1A, for a dynamic range of 100 dB when the constant reference count of number of electrons of 512 is used, the pixel conversion rate may be 125 pixels per second.

In one or more embodiments, FIG. 1B in particular illustrates the electron count equivalent of the output of the APS for four different optical powers (e.g. optical powers corresponding to photocurrents of 1 nA, 1 pA, 100 fA, and 10 fA) when a variable reference electron count is used. The line 116 may represent the variable reference electron count. In an example embodiment, for a light of intensity 1 nA as illustrated in FIG. 1B, a time of 250 ns may be taken to reach a reference count of 512 electrons. In an example embodiment as illustrated in FIG. 1B, for a light of intensity 10 fA, a time of 1 ms may be taken to reach a reference count of 512 electrons. It may be observed that using a variable reference electron count, the low intensity light of 10 fA may reach the reference electron count in $\frac{1}{8}^{th}$ of the time the low intensity light of 10 fA takes to reach the reference electron count when using a constant reference electron count. In one or more embodiments, for a given dynamic range the pixel conversion rate may significantly increase when a variable reference electron count is used. The increased pixel conversion rate may increase a speed of operation of the image sensor device.

Figure 2:
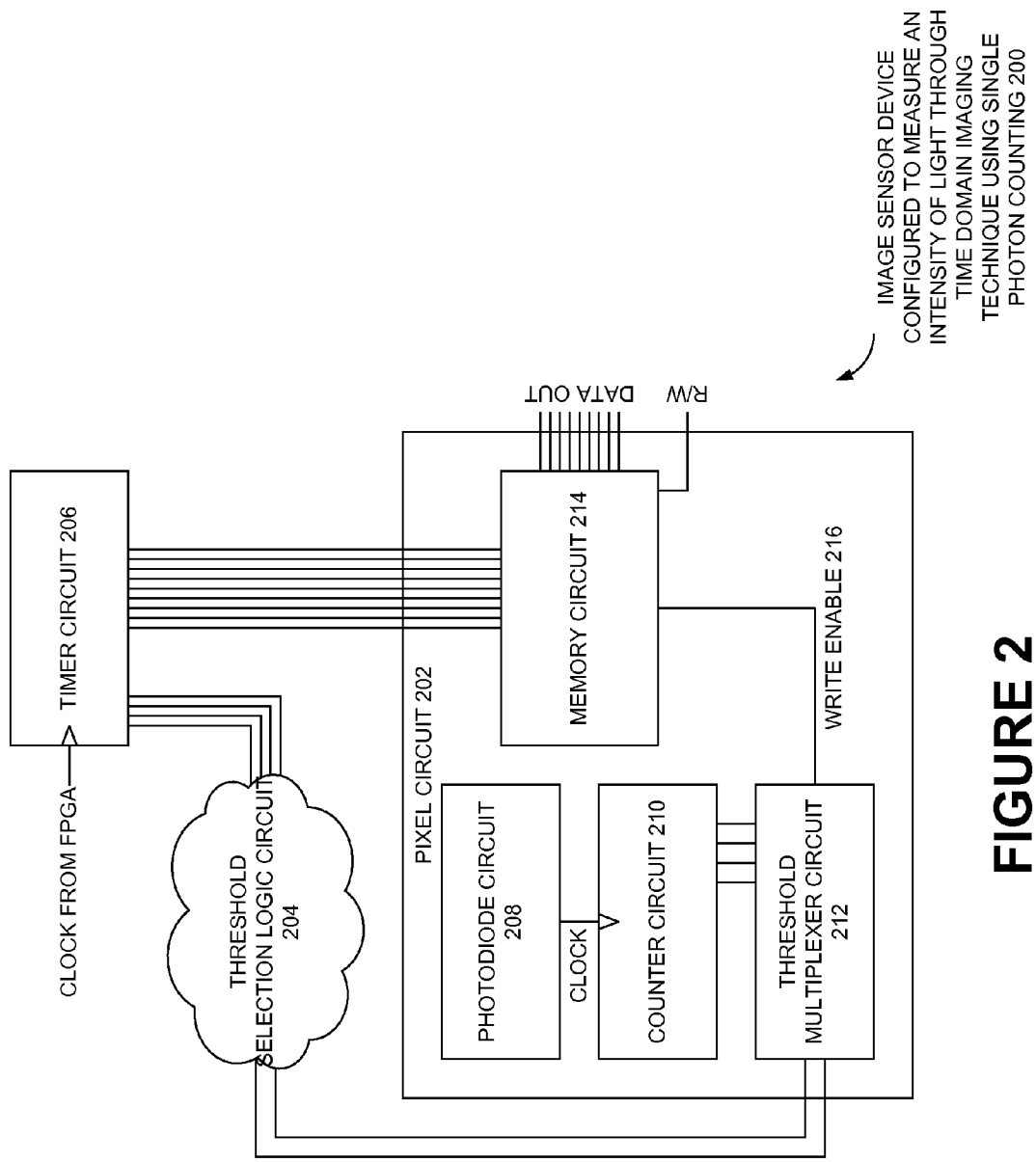
FIG. 2 is a block diagram of an image sensor device configured to measure an intensity of light through time domain imaging technique using single photon counting, in accordance with one or more embodiments.

FIG. 2 is a block diagram of an image sensor device configured to measure an intensity of light through time domain imaging technique using single photon counting, in accordance with one or more embodiments. The image sensor device 200 illustrated in FIG. 2 allows for simultaneous pixel counting and conversion for high speed operation. The image sensor device 200 illustrated in FIG. 2 includes a pixel circuit 202, a threshold selection logic circuit 204, a timer circuit 206. Each pixel circuit may contain a low deadtime active quench and reset SPAD/APD 208, a counter circuit 210 for counting and threshold detection, a threshold selection multiplexer circuit 212 and/or a memory circuit 214 (e.g., an SRAM).

In one or more embodiments, the timer circuit 206 may be clocked with a fixed rate from an external clock provided by a field programmable gate array (FPGA). The timer circuit 206 may be coupled to the memory circuit 214 and/or the threshold selection logic circuit 204. As the count of the timer circuit 206 increases, the threshold selection logic circuit 204 may reduce the reference count of electrons or photons through controlling the threshold multiplexer circuit 212. In one or more embodiments, the operation of the threshold multiplexer circuit 212 coupled with the threshold selection logic circuit 204 may generate the variable reference count of electrons or photons. In one or more embodiments, the threshold multiplexer circuit 212 may be a circuit that selects one of many analog or digital input signals and forwards the selected input into a single line (e.g., multiplexer). In one or more embodiments, the threshold selection logic 204 may be a combinational logic circuit. In one or more embodiments, the timer circuit may be an n-bit counter. In one or more embodiments, the photodiode circuit may be an active photodiode with active quench and reset circuitry.

In one or more embodiments, the count of the timer circuit 206 may be recorded in the memory circuit when the count of the number of photons or electrons reaches a reference count of number of photons or electrons respectively. In one or more embodiments, the output of the threshold selection logic circuit 204 and the counter circuit 210 may be coupled to threshold multiplexer circuit 212. The output of the threshold selection logic circuit 204 may select a reference count of number of electrons or photons. In one or more embodiments, based on the reference count of number of electrons or photons selected the threshold multiplexer will monitor an input from the counter circuit. The output of the threshold multiplexer circuit 212 is the WRITE ENABLE 216 signal. The WRITE ENABLE 216 signal will be activated through selecting an input line from the counter circuit 210. The output of the counter circuit is coupled the input of the threshold multiplexer circuit 212. Initially, the threshold multiplexer circuit 212 monitors the most significant bit of the counter circuit and as the reference count of electrons or photons is reduced the threshold multiplexer 212 may move to monitoring the bit before the most significant bit from monitoring the most significant bit, and so on.

In one or more embodiments, using the pixel circuit 202, an image frame may be completed once a maximum time is reached, or once all the pixel circuits 202 forming an array of pixel circuits 402 have recorded a time in the memory circuit 214. The image frame may be obtained through ANDing the write enable signals (e.g, WRITE ENABLE 216) from all pixels in the array. After the frame conversion is complete, the readout of the values in the memory circuit 214 may start using array access methods and memory circuit 214 array pre-charge. In one or more embodiments, the counter circuit 210 may be an analog counter when the counter circuit is implemented inside the pixel circuit 202 to increase a speed of operation of the image sensor device. The analog counter circuit may be represented as intensity measurement circuit 508 in FIG. 5 and described in FIG. 5. In one or more embodiments, the image sensor device may include multiple APDs implemented in the pixel circuit 202, to reduce a deadtime of the image sensor device.

Figure 3:
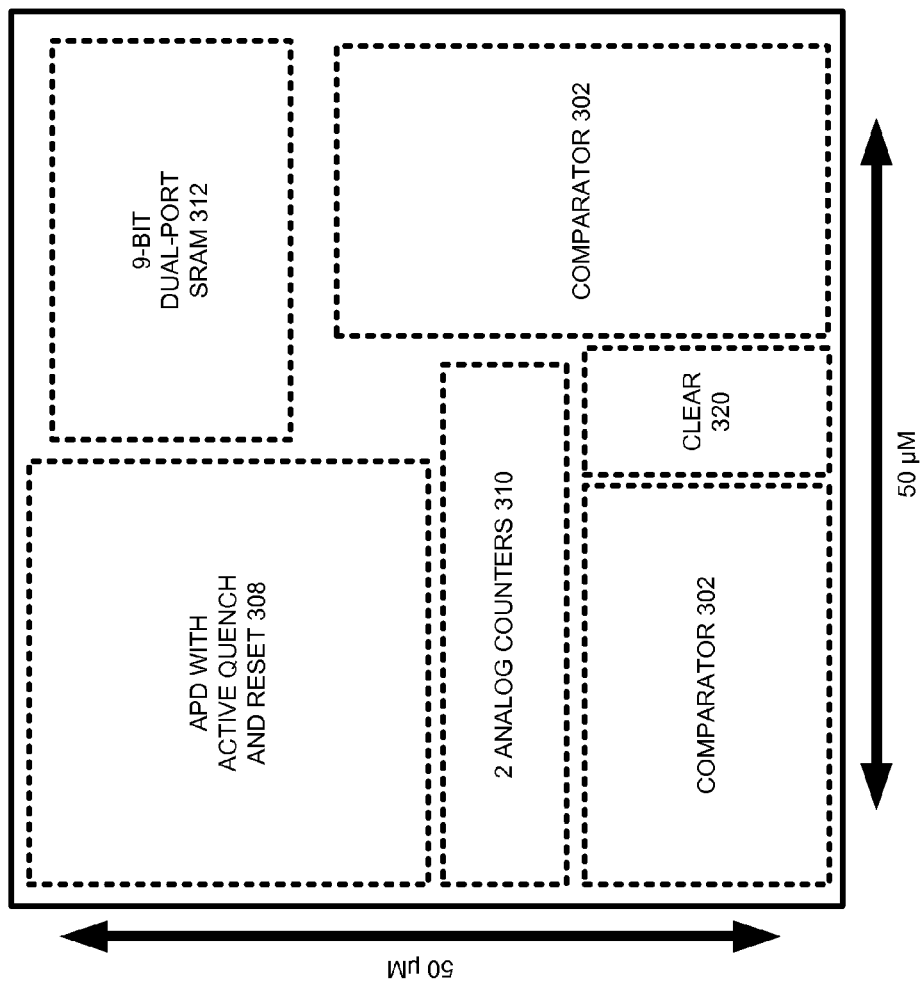
FIG. 3 is a layout of a pixel of the image sensor device illustrated in FIG. 2, in accordance with one or more embodiments.

FIG. 3 is a layout of a pixel circuit of the image sensor device illustrated in FIG. 2 in accordance with one or more embodiments. In one or more embodiments, the pixel circuit in FIG. 3 may be analogous to pixel circuit 202. In one or more embodiments, the pixel circuit may be implemented using a mainstream 130 nm CMOS process. In an example embodiment, the pixel may occupy an area of 50 μm*50 μm. The layout area occupied may vary based on implementation. In one or more embodiments, the pixel may include one or more components required for the implementation of a time domain single photon counting imager device to achieve simultaneous pixel counting (e.g., APD with active quench and reset 308, comparator 302, analog counter 310, 9-bit SRAM 312, clear circuit 320 etc.).

Figure 4:
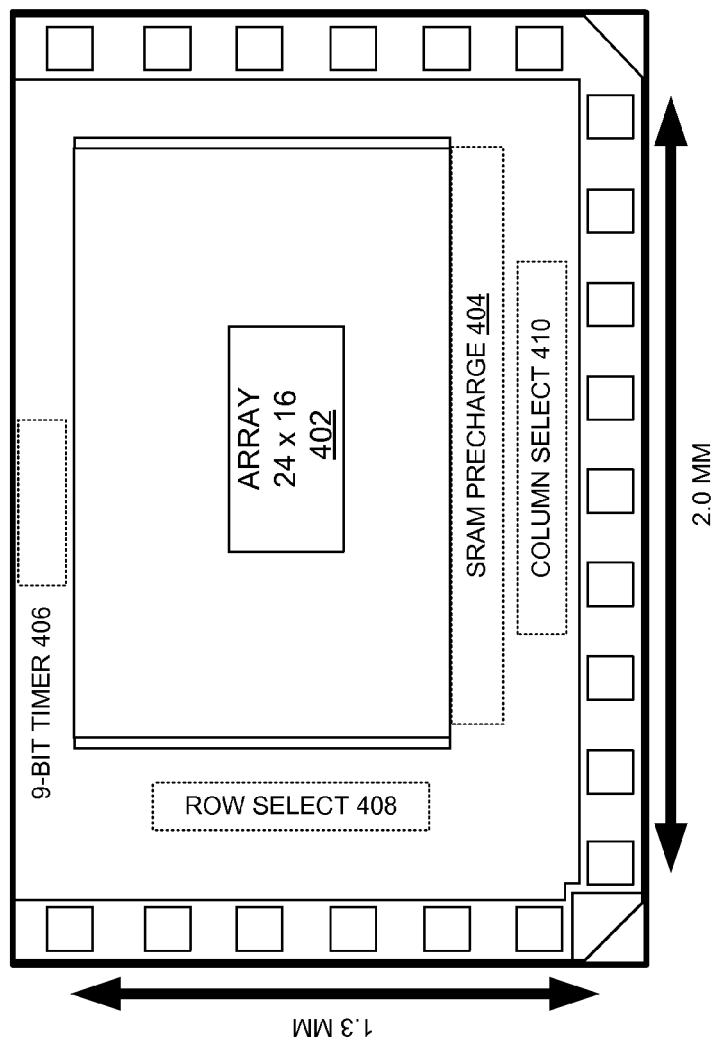
FIG. 4 illustrates a layout design of the image sensor device configured to measure an intensity of light through time domain imaging technique using single photon counting, in accordance with one or more embodiments.

FIG. 4 illustrates a layout design of the image sensor device, in accordance with one or more embodiments. In one or more embodiments, the camera on chip system illustrated in FIG. 4 may use a single timer common to all the pixels 402 and a row and column select circuitry, in addition to a SRAM pre-charge circuitry 404. When a row is selected, the SRAM outputs may be placed on a 9-bit column bus. The outputs may be then multiplexed by column selection onto a 9-bit row bus. A final output of the array 402 may be a 9-bit value that is the value stored in the SRAM of the selected pixel. In an example embodiment, the image sensor device may include a 24×16 array of pixel circuits configured to measure an intensity of light. Each pixel circuit in the 24×16 pixel circuit may be analogous to the pixel circuit 202. The array size may be smaller or larger based on an implementation technique and application of the device. The row select 408 and column select 410 inputs may be used to select a specific pixel circuit from the 24×16 pixel circuits. In an example embodiment, the timer circuit may be a 9-bit timer circuit 406. The 9-bit timer circuit may be analogous to the time circuit 206 illustrated in FIG. 2.

Figure 5:
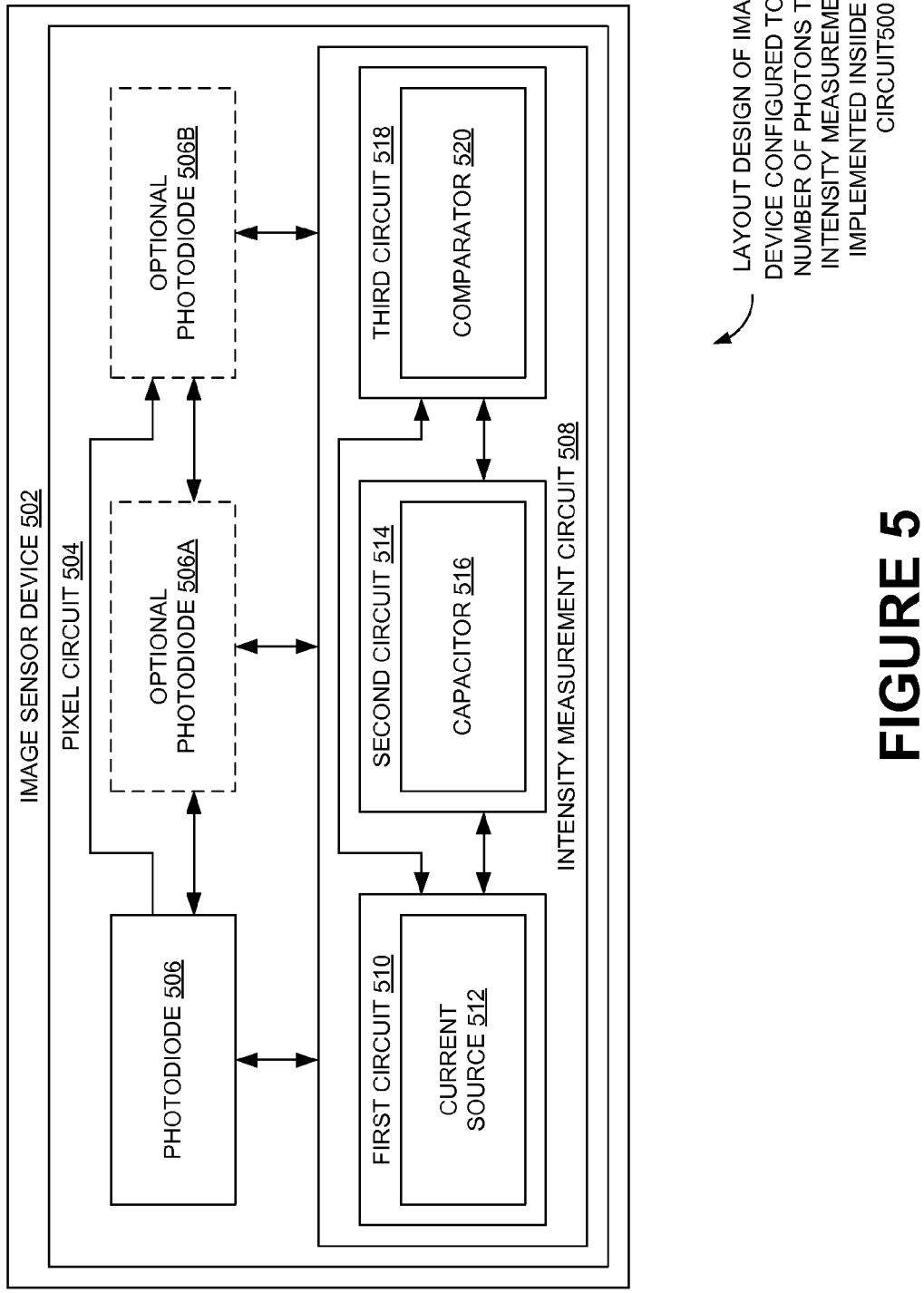
FIG. 5 illustrates a layout design of the image sensor device configured to count the number of photons through an intensity measurement circuit implemented inside the pixel circuit, in accordance with one or more embodiments.

FIG. 5 illustrates a layout design of an image sensor device configured to count the number of photons through an intensity measurement circuit implemented inside the pixel circuit, in accordance with one or more embodiments. In one or more embodiments, the image sensor device 502 may be configured to sense and/or detect the number of photons incident on the image sensor device 502 through a photodiode of the image sensor device 502. Each of the incident photons may generate a digital pulse. The digital pulse may be characterized by a fixed pulse width. In one or more embodiments, the image sensor device 502 may include a pixel circuit 504 to measure the intensity of light. The intensity of light may be proportional to the number of photons incident on the photodiode. In one or more embodiments, the image sensor device 502 may be analogous to the image sensor device 200. However, the image sensor 502 may emphasize on a different aspect of measurement of light intensity compared to image sensor device 200.

The pixel circuit 504 may include one or more photo diodes in an example embodiment. Examples of the photo diode may include, but is not limited to an avalanche photo diode (APD), a SPAD, and the like. In one or more embodiments, the photo diodes may be implemented therein to detect one or more photons. In one or more embodiments, an intensity measurement circuit 508 may be implemented inside the pixel circuit 504 to increase a speed of operation of the image sensor device 502. In one or more embodiments, the intensity measurement circuit 508 may be analogous to the counter circuit 210 in FIG. 2 when the intensity measurement circuit 508 may be implemented inside the pixel circuit 504. The intensity measurement circuit 508 may be operatively coupled to the photodiodes (e.g. photodiode 506). The intensity measurement circuit 508 may be configured to count the number of photons detected through the photo diodes. Implementing the intensity measurement circuit 508 inside the pixel circuit 504, may allow parallel counting of the number of photons incident on different photo diodes (e.g., photodiodes 506, 506A, 506B). In one or more embodiments, the intensity measurement circuit 508 may include a first circuit 510 to deliver an electric charge to the intensity measurement circuit 508 through a current source 512.

Examples of the current source 512 may include, but is not limited to, a voltage controlled current source. In one or more embodiments, the intensity measurement circuit 508 may also include a second circuit 514 to accumulate the electric charge in a capacitor 516 of the second circuit 514 electrically coupled to the current source 512. In one or more embodiments, the intensity measurement circuit 508 may further include a third circuit 518 to compare the electric charge accumulated in the capacitor 516 of the intensity measurement circuit 508 with a reference voltage through a comparator 520 of the third circuit 518. The comparator 520 may be electrically coupled to an output of the capacitor 516 of the second circuit 514. Example of the comparator 520 may include, but is not limited to an operational amplifier. In one or more embodiments, the reference voltage may correspond to a threshold number of counts of the photons incident on the photodiode (e.g. photodiode 506). In one or more embodiments, the reference voltage may be determined based on an application of the intensity measurement circuit 508. The intensity measurement circuit 508 may thereby function as a high speed analog photon counter.

In one or more embodiments, the photodiode (e.g. photodiode 506) may be disposed external to the intensity measurement circuit 508 as illustrated in FIG. 5 and the output of the photodiode 506 may be electrically coupled to an input of the current source 512 of the intensity measurement circuit 508. In one or more embodiments, the photodiode may be configured to generate a digital pulse at the output of the photodiode 506 on detecting a photon. In one or more embodiments, the generated digital pulse may activate the current source 512. In one or more embodiments, a predetermined amount of the electric charge proportional to a pulse width of the digital pulse may be delivered to the capacitor 516 of the intensity measurement circuit 508 through the current source 512 on activation of the current source 512. In one or more embodiments, an output voltage of the capacitor 516 may increase directly proportional to the electric charge accumulated in the capacitor 516. The increase in the output voltage of the capacitor 516 may correspond to the number of photons incident on the photodiode 506.

In one or more embodiments, one or more additional current sources may be coupled between a number of photodiodes and the intensity measurement circuit 508. The input of each of the current sources (e.g. current source 512) may be coupled to output of one of the photodiodes (e.g. photodiode 506) and an output of each current sources may coupled to the intensity measurement circuit 508. The intensity measurement circuit 508 may accumulate the electric charge until an output voltage of the capacitor 516 of the intensity measurement circuit 508 matches the reference voltage at the comparator 520 of the intensity measurement circuit 508. The reference voltage may correspond to a threshold number of counts of photons incident on the photodiodes (e.g. photodiode 506).

Figure 6:
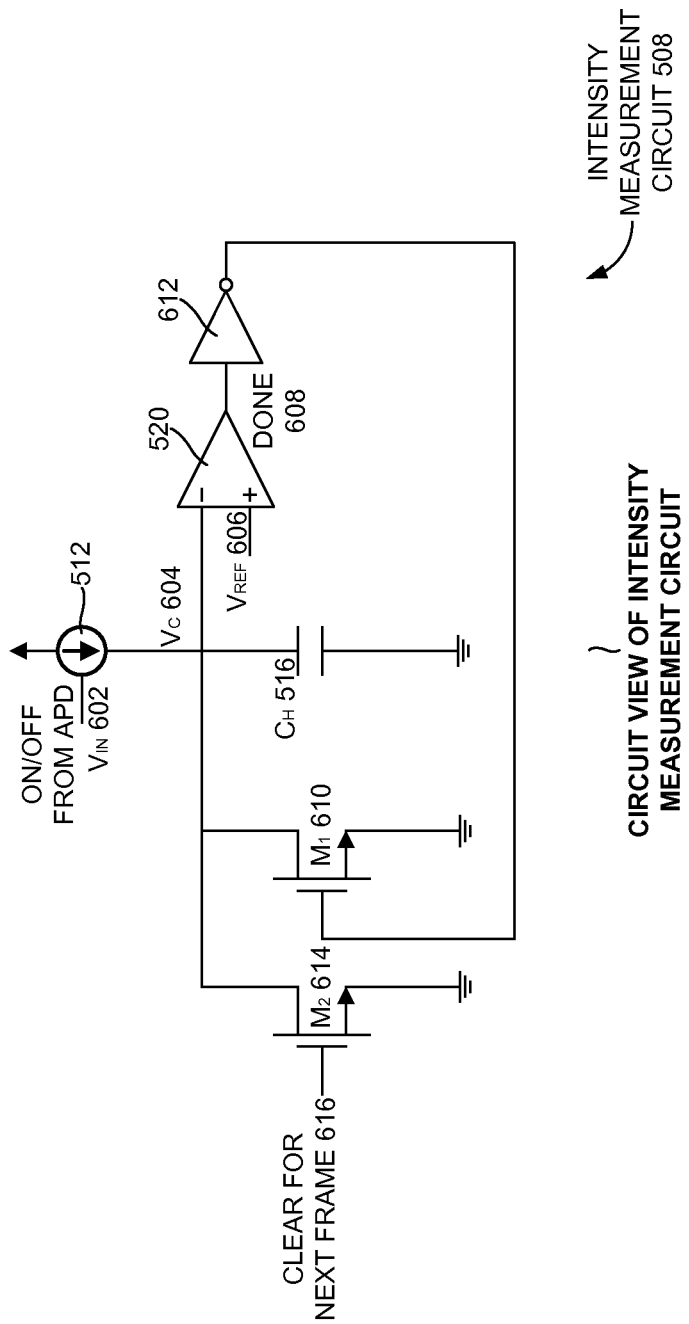
FIG. 6 is a circuit view of an intensity measurement circuit of the image sensor device illustrated in FIG. 5, in accordance with one or more embodiments.

FIG. 6 is a circuit view of the intensity measurement circuit 508 of the image sensor device 502 illustrated in FIG. 5, in accordance with one or more embodiments. As illustrated in FIG. 5, in one or more embodiments, the intensity measurement circuit 508 may include the current source 512 constituting the first circuit 510. The output of the photo diode (e.g. APD) voltage Vin, may control and/or activate the current source 512. The current source 512 may be electrically coupled to the capacitor 516. The capacitor 516 may be coupled to the comparator 520 in a manner so as to discharge the capacitor 516 when the output of comparator 520 goes high (logic 1). For example, as illustrated in FIG. 5, the capacitor 516 may be coupled to a first terminal of the comparator 520, a source terminal of a first reset transistor M1 610, and a second reset transistor M2 614. The capacitor 516 may be coupled to a first input terminal of the comparator 520. In one or more embodiments, a reference voltage Vref 606 may be applied to a second input terminal of the comparator 520.

The comparator 520 may generate a reset pulse as an output of the comparator 520 when the output of the capacitor 516 of the intensity measurement circuit 508 matches the reference voltage at the comparator 520 of the intensity measurement circuit 508. The output terminal of the comparator 520 circuit may be coupled to a logic gate (e.g. a Not gate) to negate the output of the comparator 520 to obtain a. done signal 608. The negated output of the comparator 520 may be applied to a gate terminal of the first reset transistor M1 to reset the capacitor 516. In one or more embodiments, the capacitor 516 may reset by discharging through the first reset transistor M1. In one or more embodiments, the intensity measurement circuit 508 may be reset through the second reset transistor M2. The second reset transistor M2 may reset the intensity measurement circuit 508 through a signal external to the circuit.

Figure 7A:
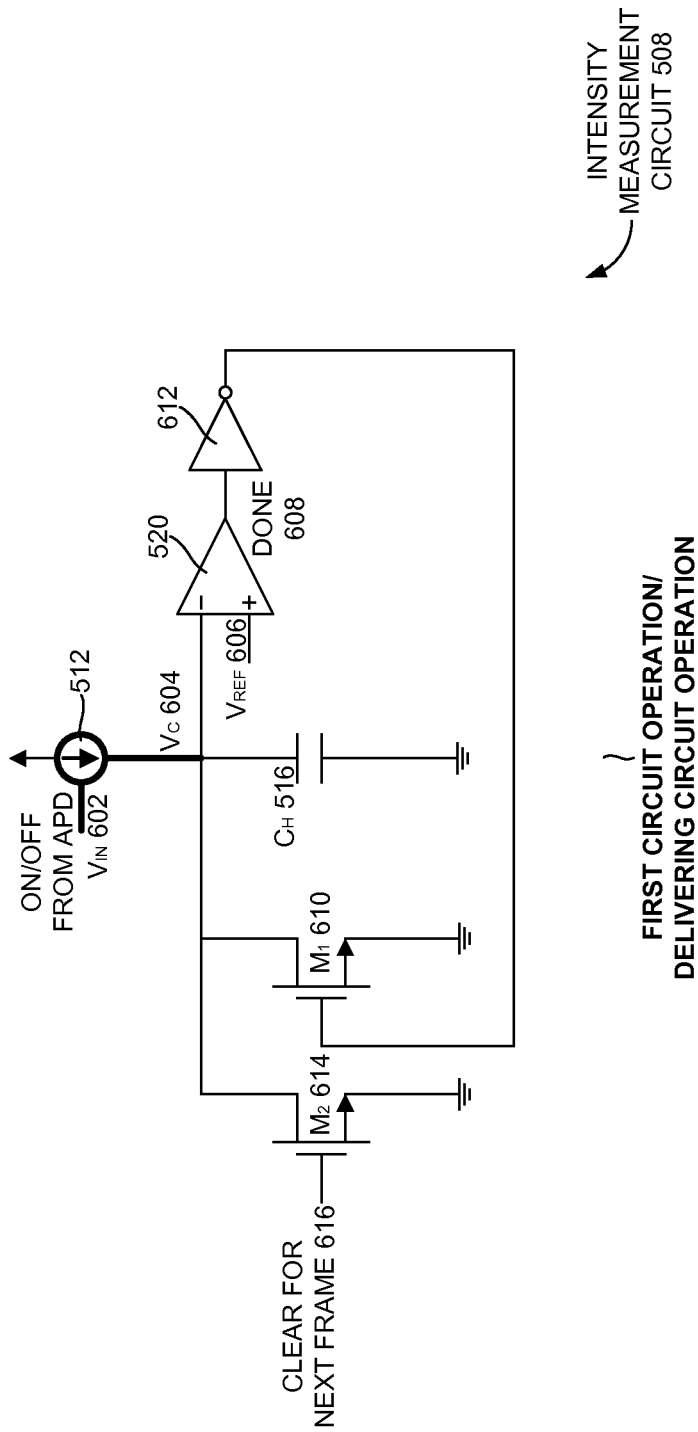
FIGS. 7A-7D illustrate a sequence of steps involved in the operation of the intensity measurement circuit illustrated in FIG. 5, in accordance with one or more embodiments.
Figure 7B:
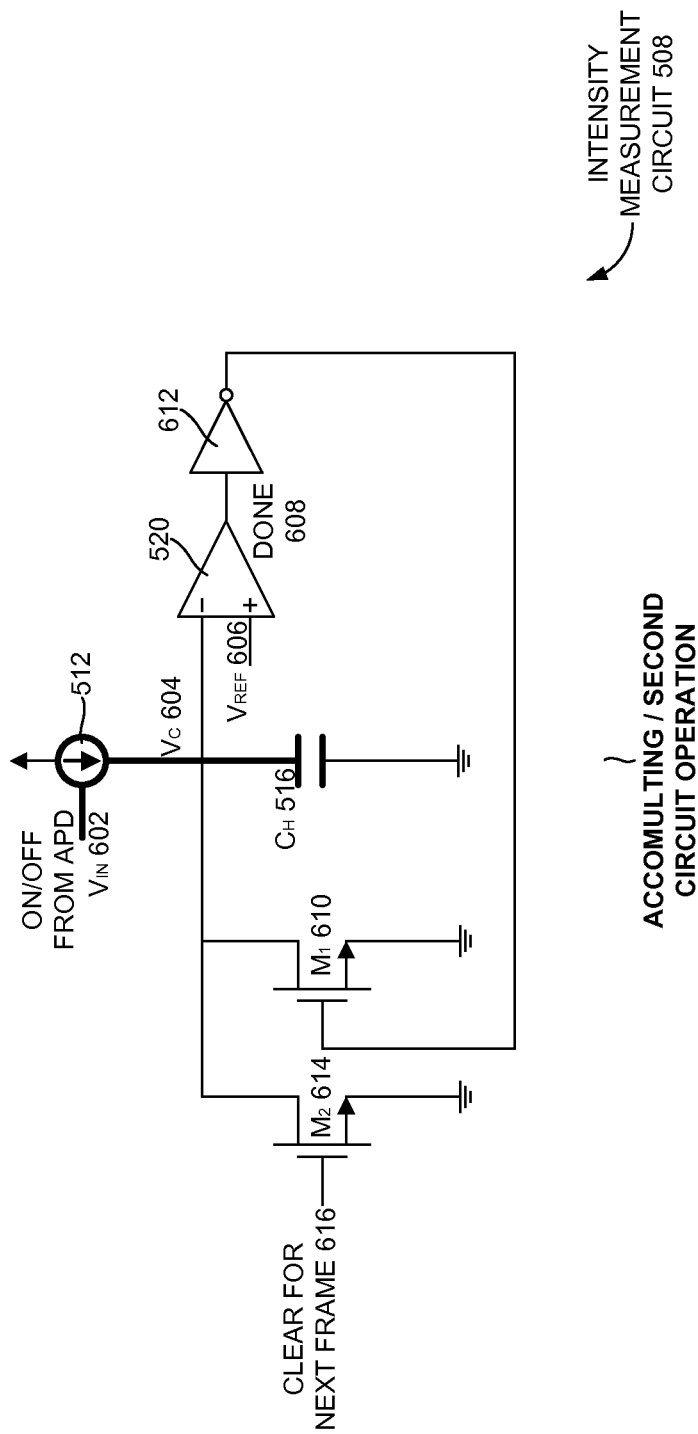

FIGS. 7A-7D illustrate a sequence of steps involved in the operation of the intensity measurement circuit 508 illustrated in FIG. 5, in accordance with one or more embodiments. FIG. 7A illustrates in particular, the operation of the first circuit 510 of the intensity measurement circuit 508. In one or more embodiments, a digital pulse Vin from the APD may switch ON the current source 512. The current source 512 may generate a current based on the digital pulse Vin. The magnitude of the current generated may depend on a pulse width of the digital pulse Vin. FIG. 7B illustrates the operation of the second circuit 514 within the intensity measurement circuit 508. The generated current from the current source 512 may charge the capacitor 516 to an output voltage $V_C$. The output voltage $V_C$ of the capacitor 516 may be incremented in steps based on the pulse width of each digital pulse generated by each photon detected through the APD.

The increase in the capacitor voltage $V_C$ is given by equation (1).

$$V_C(n) = (nI\tau_{PD}/C_H) + V_0, \quad (1),$$

Figure 7C:
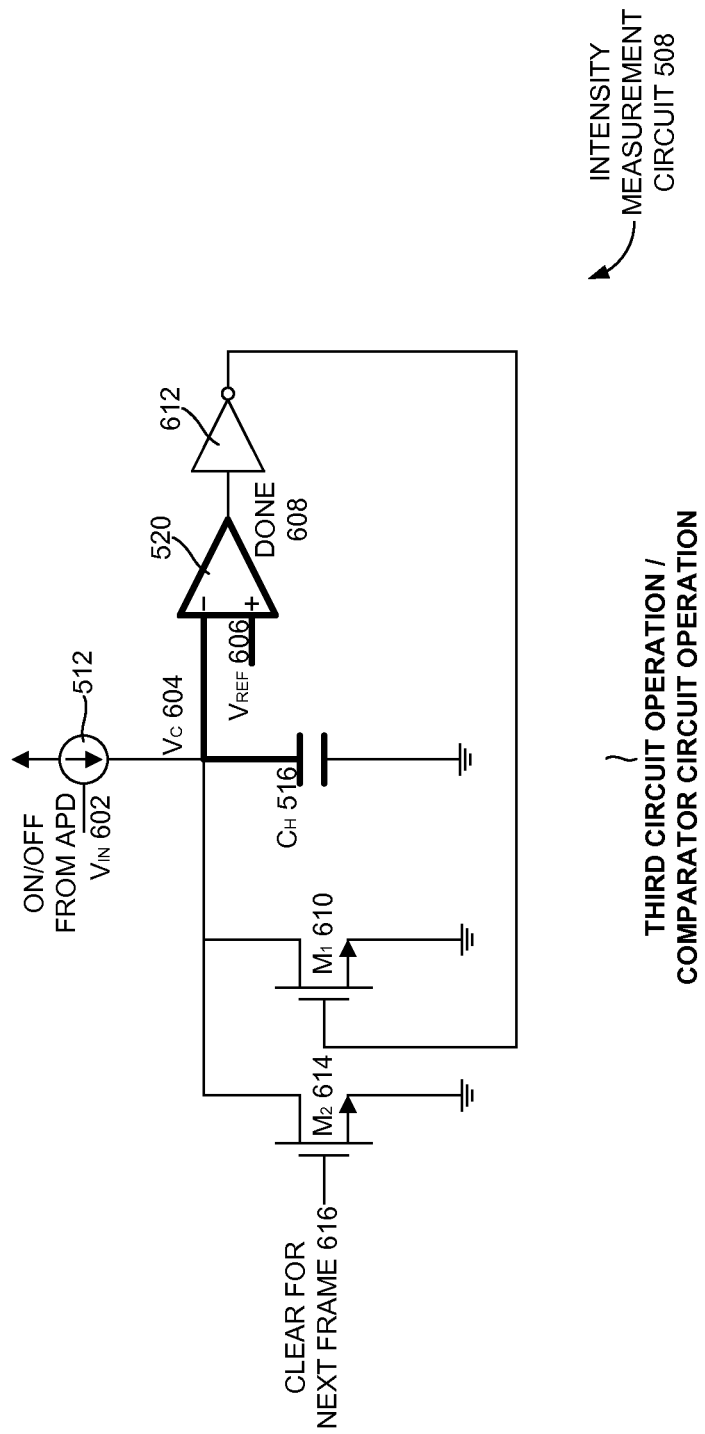

$V_C$ being the capacitor output voltage as a function of count (n), I is the current of the current source 112, $\tau_{PD}$ is a deadtime of the photodiode, and $V_0$ is the initial voltage of the capacitor $C_H$. The voltage $V_C$ increases in steps relative to a number of counts of the received photons at the APD. FIG. 7C illustrates operation of the third circuit 518 of the intensity measurement circuit 508. The output voltage $V_C$ 604 of the capacitor 516 may be compared to a reference voltage Vref 606 through the comparator 520. The comparator 520 may generate a low output signal (e.g., logic 0) when the voltage $V_C$ 604 is equal to the voltage Vref 606.

Figure 7D:
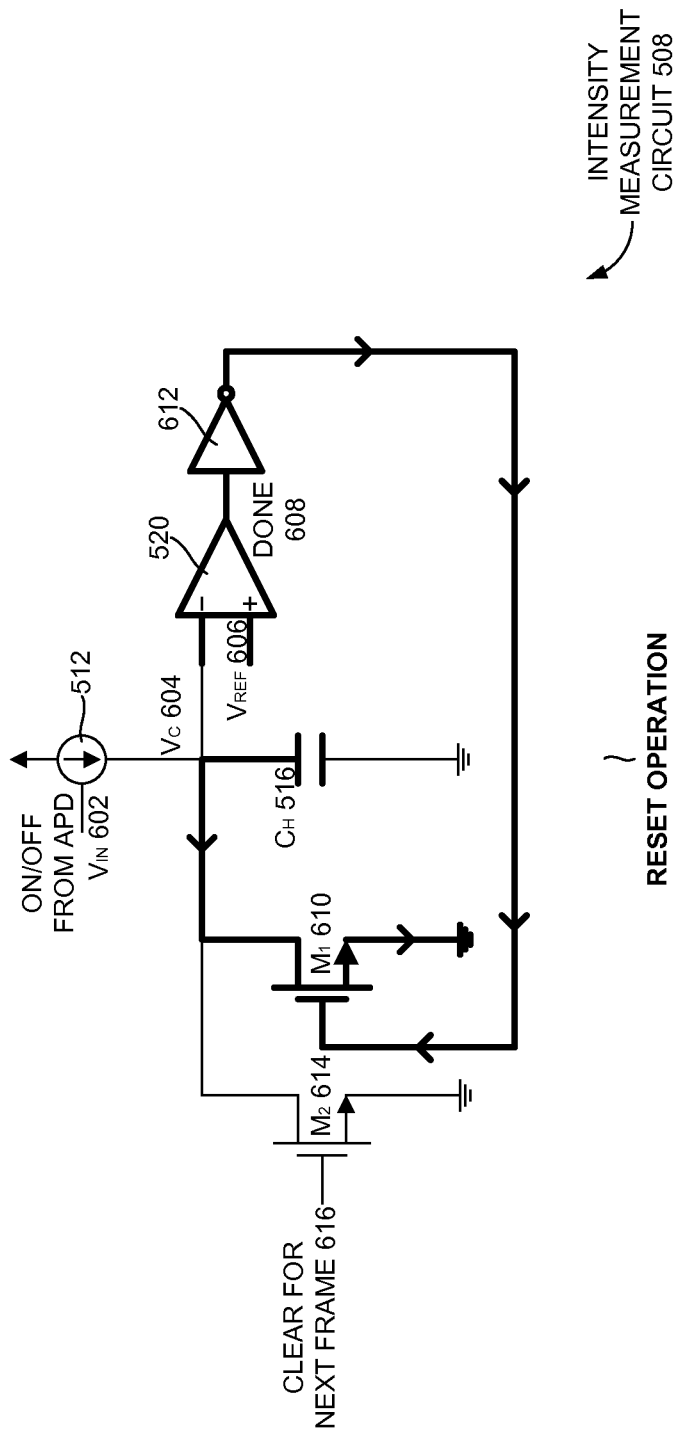

The reference voltage Vref may be a voltage corresponding to a predetermined number of photons, and may thereby represent a predetermined count of the number of photons received at the APD. The output voltage $V_C$ across the capacitor 516 may be incremented in steps till the output voltage $V_C$ 604 reaches Vref 606. The third circuit 518 thereby may function as an analog counter to count the photons detected by the APD. FIG. 7D illustrates a reset operation, in accordance with one or more embodiments. The low output signal (e.g. done signal 608) of the comparator 520 may be negated through a NOT gate 612 to obtain a high reset signal (logic 1). The high reset signal may be fed to gate terminal of the first reset transistor M1 to switch ON the first reset transistor M1. When the first reset transistor M1 is switched ON, the capacitor 516 may reset by discharging through the first reset transistor M1. Thereby, the count of the photons may be reset. Further, an external reset input 616 may be fed to the gate terminal of the second reset transmitter 614 to reset the intensity measurement circuit 508. The intensity measurement circuit 508 may be reset before the capturing the next frame of an image.

Figure 8:
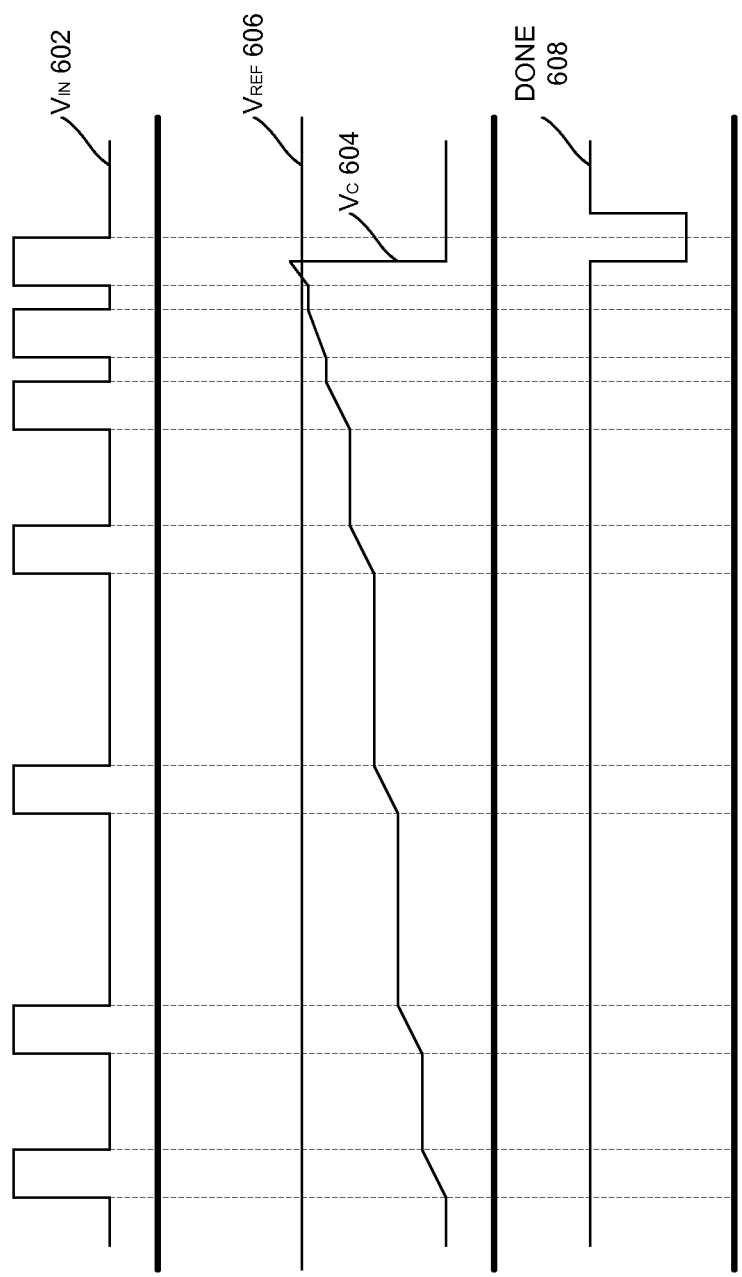
FIG. 8 illustrates various waveforms obtained through simulation of an operation of the intensity measurement circuit, in accordance with one or more embodiments.

FIG. 8 illustrates various waveforms obtained through simulation of an operation of the intensity measurement circuit 508, in accordance with one or more embodiments. As illustrated in FIG. 8, for every digital pulse Vin 602 generated through the APD, the output voltage $V_C$ 604 of the capacitor 516 increments in steps based on the pulse width of the digital pulse. When the voltage $V_C$ 604 is equal to the Vref 606, the capacitor 516 may be discharged and the voltage $V_C$ may go low.

Figure 9A:
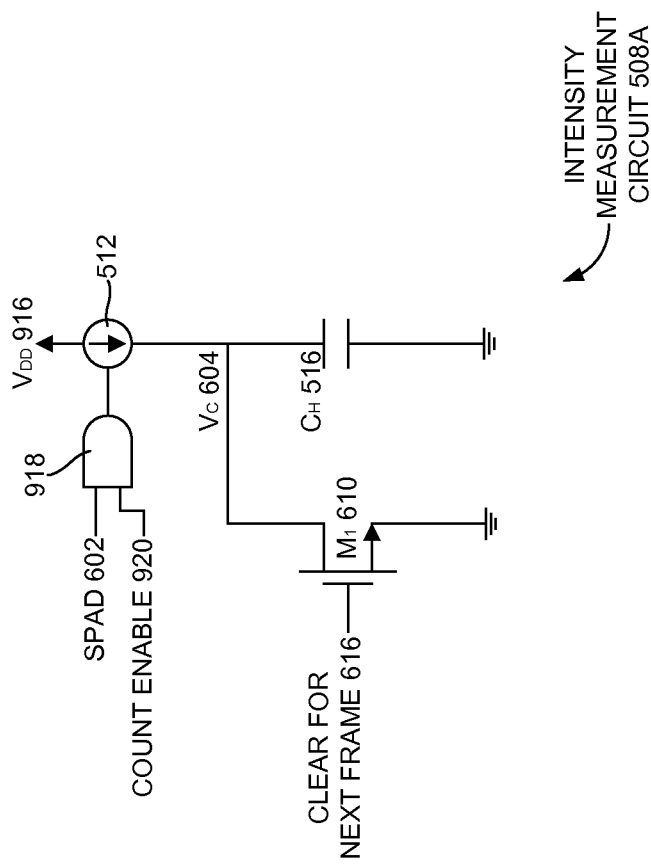
FIG. 9A illustrates an intensity measurement circuit configured for in pixel counting of photons received at a SPAD, in accordance with one or more embodiments.

FIG. 9A illustrates an intensity measurement circuit 508A configured for in pixel counting of photons received at a SPAD, in accordance with one or more embodiments. An output 602 of the SPAD may be coupled to the current source 512 through an AND gate 918 as illustrated in FIG. 9A. A count enable signal 920 may control and/or activate the current source 512. When a digital pulse is received at the SPAD and the count enable 920 may go high. Consequently, the current source 512 may be activated and a current of predetermined magnitude may be generated. The current source 512 may be electrically coupled to the capacitor $C_H$ 516. The generated current may charge the capacitor $C_H$ to an output voltage $V_C$ 604. The output voltage $V_C$ 604 may increment in steps with each photon received at the SPAD. The capacitor 516 may be coupled to a comparator 520 as illustrated in the intensity measurement circuit 508 of FIG. 5 to count the number of photons received at the SPAD.

Figure 9B:
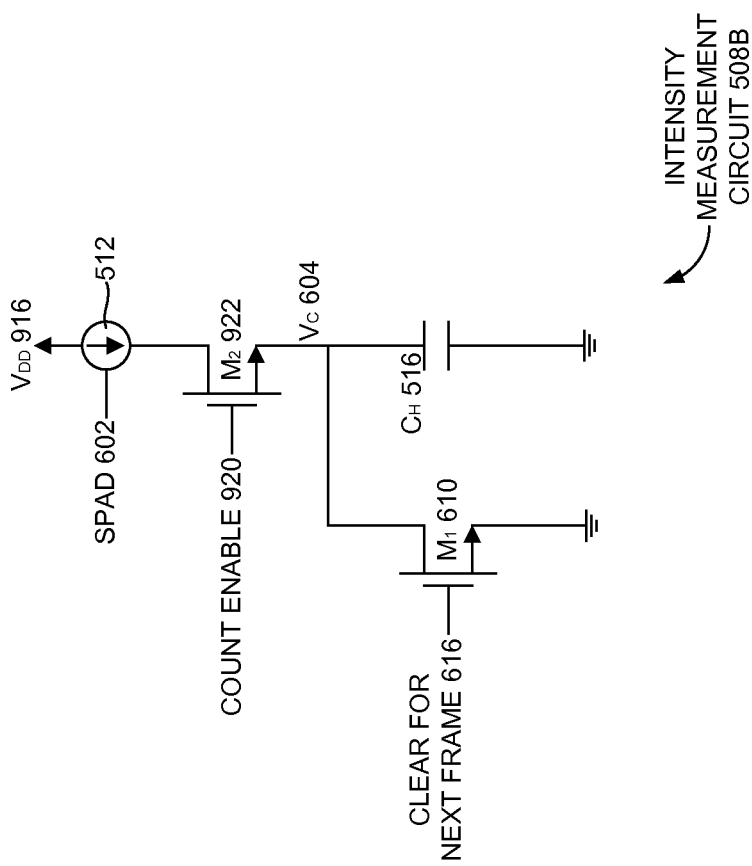
FIG. 9B illustrates another embodiment of the intensity measurement circuit, in accordance with one or more embodiments.

FIG. 9B illustrates another embodiment of the intensity measurement circuit 508B. In one or more embodiments, the intensity measurement circuit 508B illustrated in FIG. 9B may be configured for in-pixel counting of photons detected through the SPAD. In one or more embodiments, the current source 512 may be coupled to the capacitor $C_H$ 516 through a transistor M2 922 controlled by a count enable 920. The transistor M2 922 may be configured to function as a switch. When the count enable 920 is high, the transistor M2 922 may be switched ON and when the cont enable 920 is low the transistor M2 may be switched OFF. The transistor M2 922 may control charging of the capacitor $C_H$ 516 through the current source 512. The transistor M2 922 may thereby be used to enable or disable the analog counter. A digital pulse received from the SPAD may activate the current source 512 and the current source 512 may generate a current proportional to the pulse width of the digital pulse. When the count enable 920 is set to high (logic 1), the current generated may charge the capacitor $C_H$ 516 to a voltage $V_C$. With every photon received at the SPAD, the voltage $V_C$ may be incremented in steps proportional to the pulse width of the digital pulse. The voltage $V_C$ may be coupled to a comparator 520 as illustrated in FIG. 5 to count the number of photons received at the SPAD.

Figure 10:
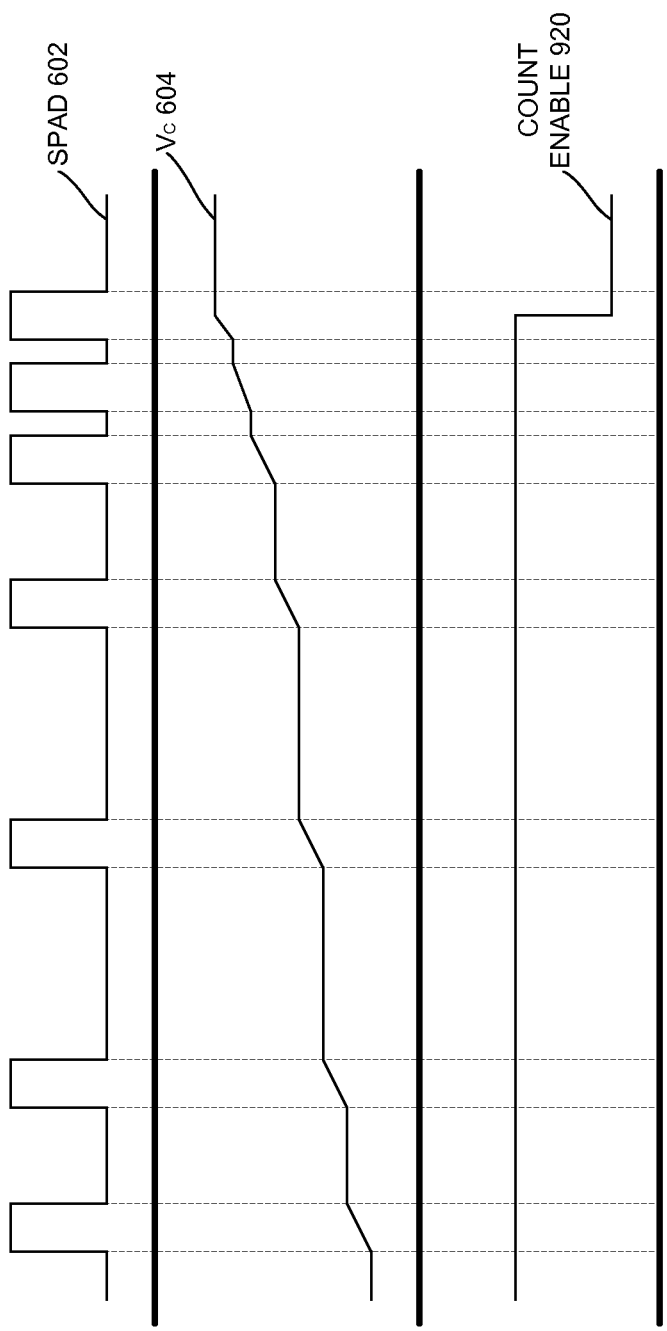
FIG. 10 is a wave diagram illustrating various waveforms obtained through simulation of operation of the intensity measurement circuits of FIGS. 9A and 9B, in accordance with one or more embodiments.

FIG. 10 is a wave diagram illustrating various waveforms obtained through simulation of operation of the intensity measurement circuits of FIGS. 9A and 9B. As illustrated in FIG. 10, at every instance of receiving a digital pulse from an output 602 of a SPAD, when the count enable 920 is high, the output voltage $V_C$ of the capacitor $C_H$ 516 may be incremented in steps through a predetermined amount. The output voltage $V_C$ of the capacitor $C_H$ 516 may increment in steps as long as the count enable 920 remains high. When the count enable 920 goes low, the output voltage $V_C$ may remain constant and may not increment in steps even when subsequent digital pulses are received at the SPAD.

In an example embodiment, an analog counter may provide an infinite count. A choice of small step would require a very accurate comparator and may be hard to be implemented for high speed operation within small area of a pixel. For high count of the analog counter, two or more stages of the intensity measurement circuit 508 (e.g. intensity measurement circuit illustrated in FIG. 5) may be cascaded/serially connected. The cascading may allow obtaining a counter with a capacity equal to product of the counts of the various stages cascaded together. In one or more embodiments, an nth intensity measurement circuit of the n-number of intensity measurement circuits may be activated through the output of an $(n-1)^{th}$ intensity measurement circuit of the n-number of the intensity measurement circuits.

The capacitor of the $n^{th}$ intensity measurement circuit may be electrically coupled to the output of the comparator of the $(n-1)^{th}$ intensity measurement circuit through an nth current source. The capacitor $C_H$ 516 of a first circuit 510 may be electrically coupled to the output of the photodiode through the current source.

The n-number may be determined through a threshold fill factor of the pixel, a fill factor of the pixel being an area occupied by an active area of a photodiode as compared to a combined layout area of the photodiode, the circuit, the n-number of the intensity measurement circuit, the comparator and the current source in the pixel. The maximum number of incident photons that the intensity measurement circuit can count may be incremented to increase a dynamic range of intensity measurement circuit 508. The serial coupling of the n-number of the intensity measurement circuits may reduce the sensitivity requirements of the comparator through limiting the maximum count of each stage to have a large count step size.

Figure 11A:
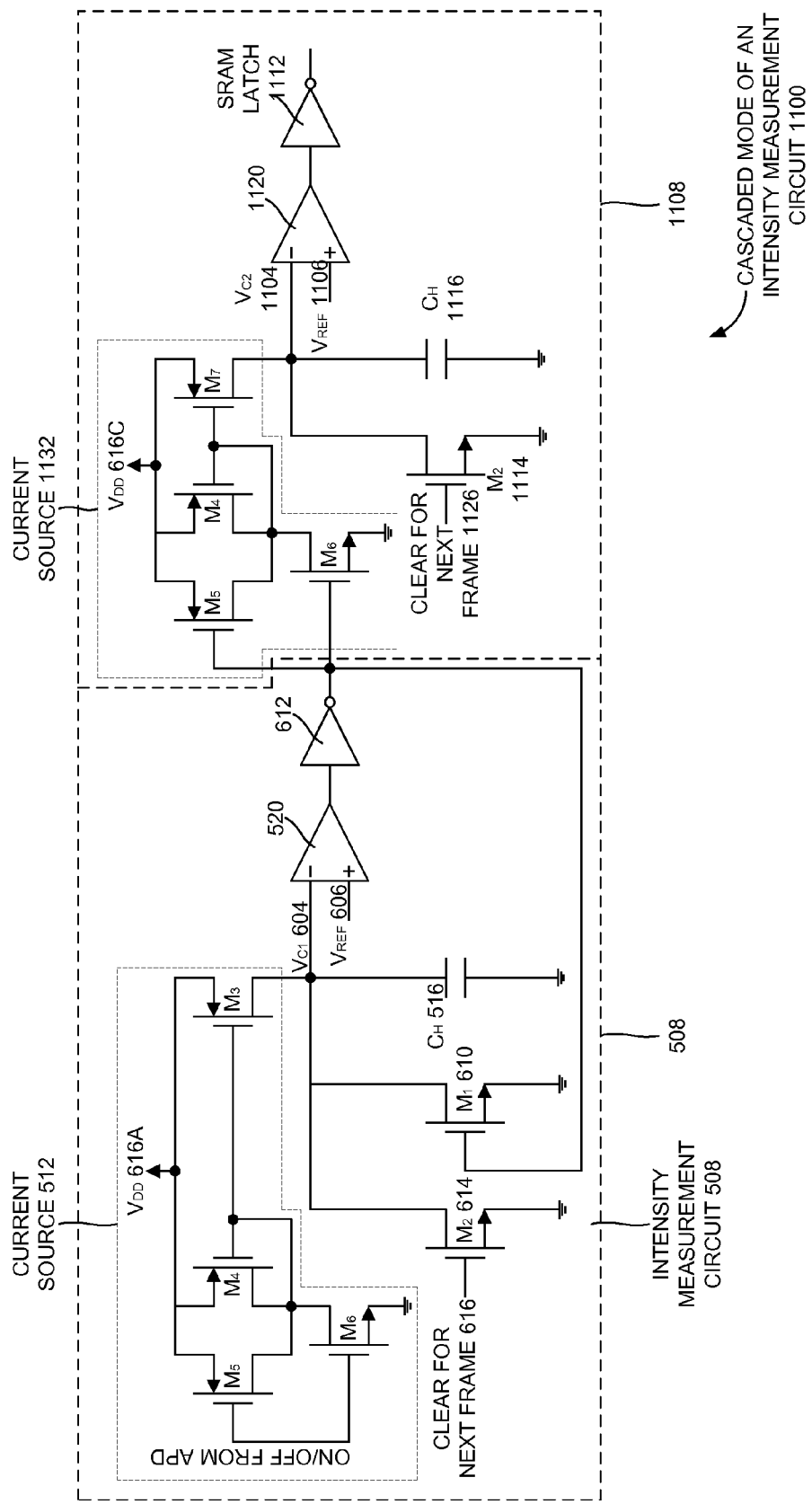
FIG. 11A illustrates a schematic diagram of a cascaded mode of an intensity measurement circuit with a pair of counters, in accordance with one or more embodiments.

FIG. 11A illustrates a schematic diagram of a cascaded mode of an intensity measurement circuit 1100 with a pair of counters (e.g. a first counter 508 and a second counter 1108), in accordance with one or more embodiments. Each of the counters 508 and 1108 may be similar in configuration to the intensity measurement circuit 508 illustrated in FIG. 5. The two circuit to count (e.g., first counter 508, second counter 1108) may be serially coupled to increment the maximum number of incident photons countable through the circuit. The second counter circuit 1108 may be activated through the output of the first counter circuit 508. The cascaded mode may be a mode in which the counter circuits are serially coupled to each other with the output of one circuit coupled to the input of the second circuit and so on. For example, if there were 4 counter circuits, the 4 counter circuits would be serially coupled to each other such that the output of counter 1 is coupled to the input of counter 2 and the output of counter 2 is coupled to the input of counter 3 and the output of counter 3 is coupled to the input of counter 4.

The first counter 508 may include a current source 512 one or more digital pulses from an APD for activation and coupled to a first capacitor $C_H$ 516. The output voltage Vc1 of the first capacitor $C_H$ 516 is fed to a first input terminal of a first comparator 520. A reference voltage is fed to a second input terminal of the first comparator 520. The output of the first comparator 520 is complemented through a NOT gate 612 and complemented output is used to activate a first reset transistor M1 to discharge the first capacitor 516 through transistor M1 and thereby reset the count. The first counter 508 may be reset by providing a clear 616 input to a gate terminal of a second reset transistor M2, to move to a next frame. Also, the complemented output of the first comparator 520 is used to activate a second current source 1132 of the second counter 1108.

The transistors M4, M6 and M3 may be configured to operate as a current minor. The transistors M4, M6 and M3 may minor the current between the transistors M4 and M6 to the branch between M3 and the capacitor $C_H$ 516. The current minors are switched ON once transistor M6 functioning as a pull down transistor and transistor M3 are OFF. The intensity measurement circuit of FIG. 11A may have a counting capacity equal to the product of counts of the first counter 508 and the second counter 1108. For example, if the first counter 508 has a count of 12 for a given integration time and the second counter 1108 has a count of 22, the total count of the intensity measurement circuit 1100 would be 264. The second counter 1108 may include a second comparator 1120 to compare an output voltage Vc2 of a second capacitor 1116 with a second reference voltage Vref2 1106 to generate a second output signal. The second comparator 1120 may be an open loop comparator.

The output signal may be fed into a static random access memory latch (SRAM latch) 1112 to function as a write enable signal to latch the count in an SRAM. Also, an external signal 1126 may be fed into a gate terminal of the transistor M2 1114 to reset the second counter 1108 and to move on to next frame. The second capacitor 1116 may discharge through transistor M2 1114 to reset the count of the second counter 1108. The second capacitor 1116 continues to charge beyond Vref2 till the external signal 1126 is fed to the transistor M2. The first counter 508 counts the digital pulses from the APD, with a pulse width close to the APD deadtime. The first counter 508 gets reset once the threshold is reached. The second counter 1108, counts the output of the first counter until a threshold voltage is reached and then stops, latching the SRAM, until the second counter 1108 is reset for the next frame.

Figure 11B:
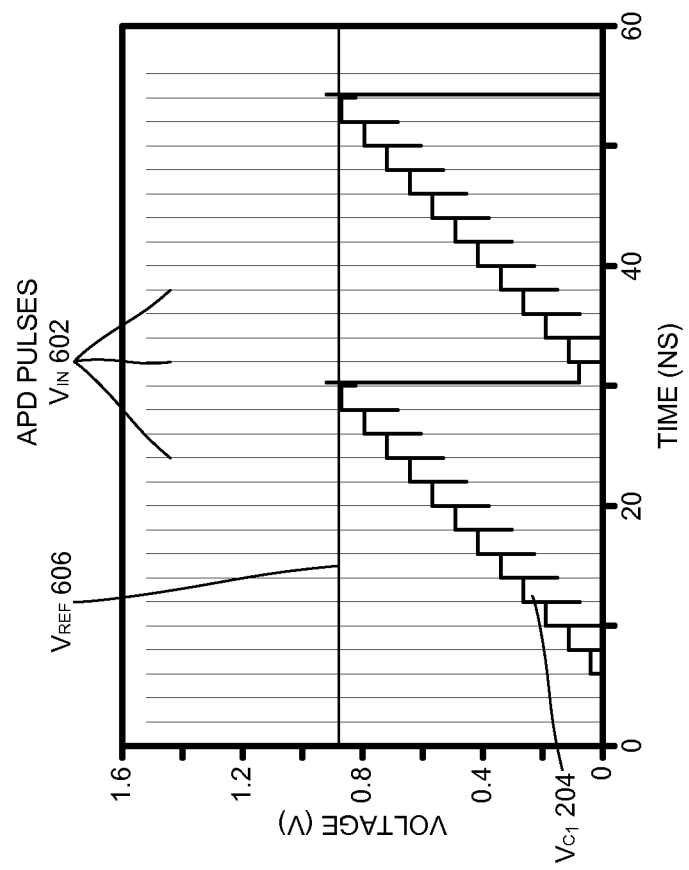
FIGS. 11B-11C illustrate voltage versus time plots obtained from a simulation of the operation of the cascaded intensity measurement circuit illustrated in FIG. 11A, in accordance with one or more embodiments.
Figure 11C:
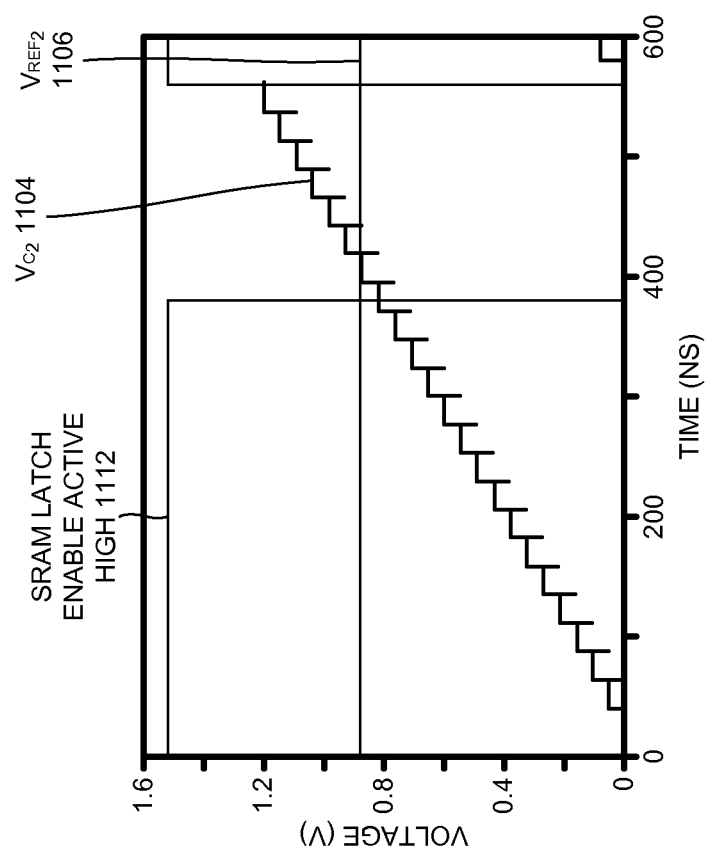

FIGS. 11B-11C illustrate voltage versus time plots obtained from a simulation of the operation of the cascaded intensity measurement circuit illustrated in FIG. 11A, in accordance with one or more embodiments. As illustrated in FIG. 11B, the output voltage $V_{C1}$ of the first capacitor 516 increments in steps with every digital pulse Vin 602 received from the APD. The capacitor 516 may discharge when the voltage $V_{C1}$ reaches $V_{REF1}$ 606 and the output voltage Vc1 may go low. As illustrated in FIG. 11C, the output voltage $V_{C2}$ 1104 of the second capacitor 1116 may increment in steps for every high output signal from the first counter 108. When the voltage $V_{C2}$ 1104 reaches $V_{REF2}$ 1106, the SRAM enable signal 1112 obtained from the output of the second comparator 1120 goes low as illustrated in FIG. 11C. The voltage $V_{C2}$ 1104 goes on stepping up beyond $V_{REF2}$ 1106 till the external signal 1126 is fed to the transistor M2 to discharge the second capacitor 1116 to reset the second counter 1108. The SRAM may be enabled until the voltage threshold is reached. In one or more embodiments, the second capacitor 1116 may be discharged as soon as the count is latched in the SRAM and the external signal 1126 is fed. The second counter 1108, counts the output of the first counter 508 until a threshold voltage is reached and then stops, latching the SRAM until the second counter 1108 is reset for the next frame.

Figure 12:
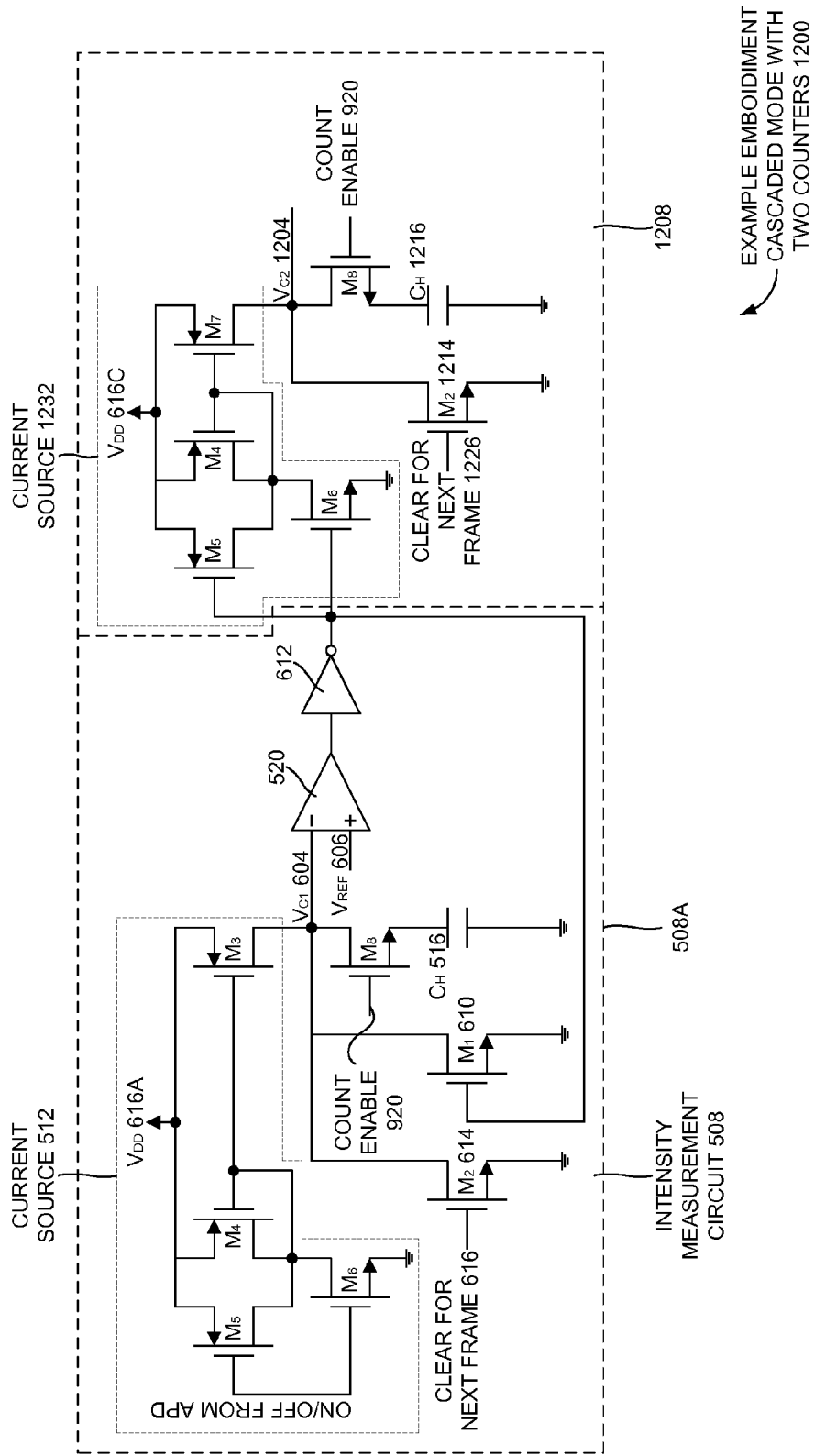
FIG. 12 illustrates a schematic diagram of another embodiment of a cascaded mode of an intensity measurement circuit with a pair of counters and with a counter enabling/disabling mechanism, in accordance with one or more embodiments.

FIG. 12 illustrates a schematic diagram of another embodiment of a cascaded mode of an intensity measurement circuit 1200 with a pair of counters (e.g. a first counter 508A and a second counter 1208) and with a counter enabling/disabling mechanism, in accordance with one or more embodiments. The enabling and/or disabling mechanism may include a transistor M8 enabled through an external count enable 920 signal. Except for the transistor M8 coupled between the current sources (e.g., a first current source 512 of a first counter 508 A and a second current source 1232 of a second counter 1208) and capacitors 516 and 1216, the first counter 508 A and the second counter 1208 may be similar in configuration to the first counter 508 and the second counter 1108 of the intensity measurement circuit illustrated in FIG. 11A. In one or more embodiments, the count enable 920 signal may also control the discharging of the capacitors 516 and 1216. The transistors M4, M6 and M3 form a current mirror to minor the current between the transistors M4 and M6 to the branch between M3 and the capacitor $C_H$. The current mirrors are switched ON once transistor M6 functioning as a pull down transistor and transistor M3 are OFF. The intensity measurement circuit of FIG. 12 may have a counting capacity equal to the product of counts of the first counter 508 A and the second counter 1208.

Figure 13A:
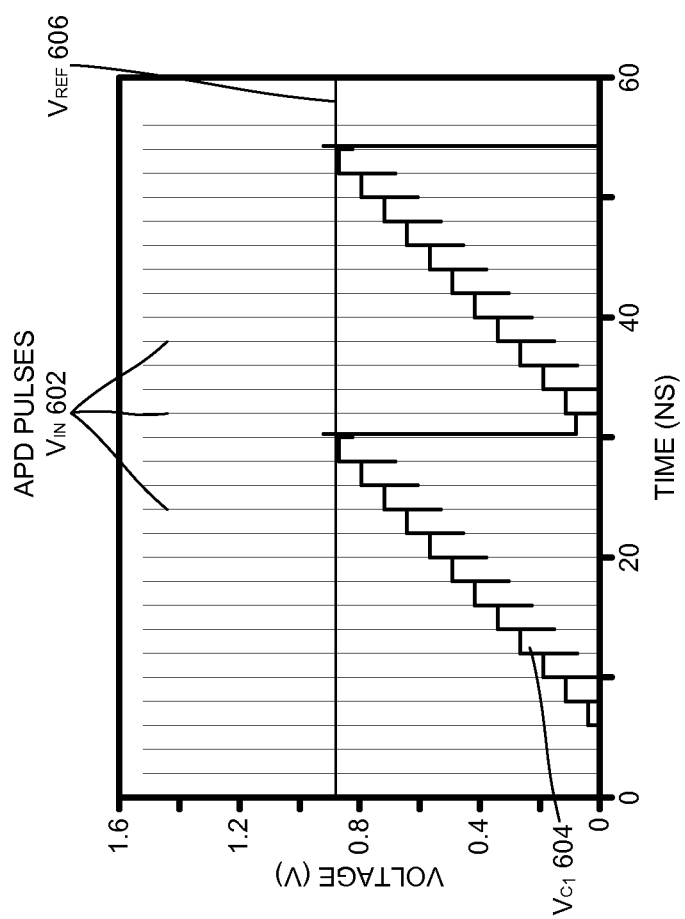
FIGS. 13A-13B illustrate voltage versus time plots obtained from simulation of operation of the intensity measurement circuit of FIG. 12, in accordance with one or more embodiments.
Figure 13B:
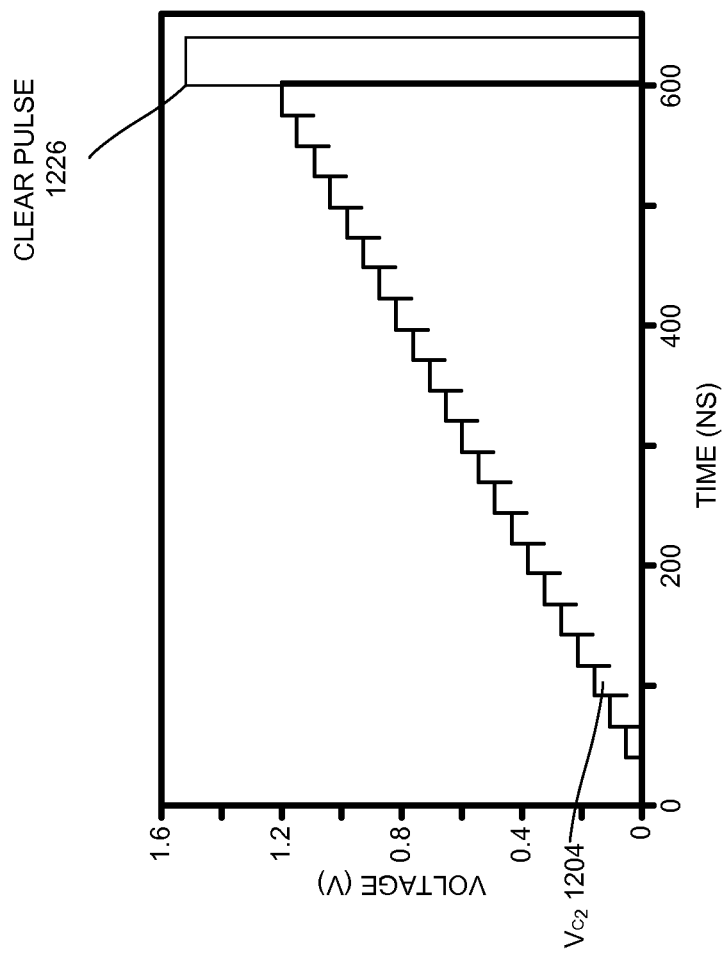

FIGS. 13A-13B illustrate voltage versus time plots obtained from simulation of operation of the intensity measurement circuit of FIG. 12. As illustrated in FIG. 13A, the voltage Vc1 604 may increment in steps on receiving each of the digital pulses Vin 602 from the APD, until the voltage Vc1 604 reaches Vref 606. On reaching Vref 606, the capacitor $C_H$ 516 discharges and the Vc1 falls to 0V. With reference to FIG. 13B, the output voltage Vc2 1204 of the second capacitor 1216 may increment in steps on receiving each output from the first counter 508 A and falls until a clear pulse 1226 is received from an external circuit.

In one or more embodiments, a speed of operation of a measurement device may be increased through implementing the circuit inside the pixel. In one or more embodiments, a maximum number of incident photons countable through the circuit may be independent of the number of transistors in the circuit. In one or more embodiments, an n number of circuits may be serially coupled to increment the maximum number of incident photons countable through the circuit. In one or more embodiments, an nth circuit of the n-number of the circuit may be activated through the output of an $(n-1)^{th}$ circuit of the n-number of the circuits. The capacitor of the $n^{th}$ circuit may be electrically coupled to the output of the comparator of the $(n-1)^{th}$ circuit through an nth current source. In one or more embodiments, the capacitor of a first circuit may be electrically coupled to the output of the photodiode through the current source.

The n-number may be determined through a threshold fill factor of the pixel, a fill factor of the pixel being an area occupied by an active area of a photodiode as compared to a combined layout area of the photodiode, the circuit, the n-number of the circuit, the comparator and the current source in the pixel. In one or more embodiments, the maximum number of incident photons that the circuit can count may be incremented to increase a dynamic range of a measurement device. In one or more embodiments, the serial coupling/cascading of n-number of the circuits may reduce the sensitivity requirements of the comparator through limiting the maximum count of each stage to have a large count step size. In one or more embodiments, a high speed analog counter may be coupled to two or more photodiodes (e.g. APD, SPAD) of the pixel circuit 504 to simultaneously count the number of photons received at the photodiodes. By using two or more photodiodes per pixel, a deadtime of the pixel may be reduced by two or more respectively, as compared to using a single analog counter for each photodiode. The deadtime limits the rate of counting the photons.

Figure 14A:
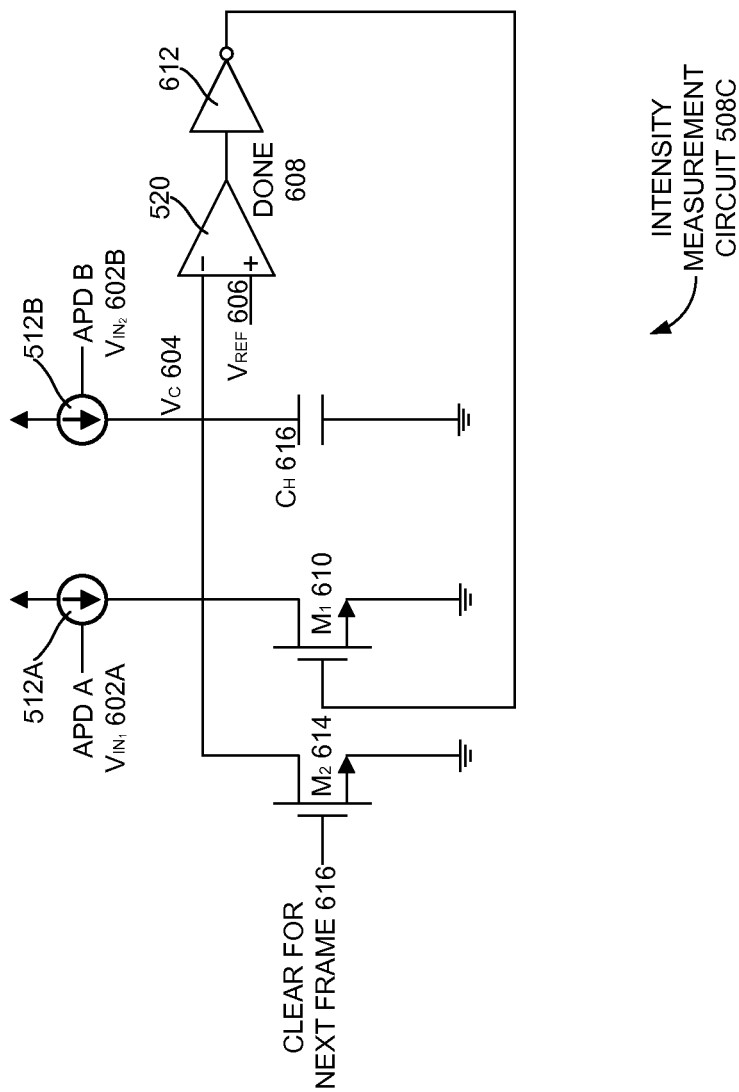
FIG. 14A illustrates an intensity measurement circuit with multiple photodiodes per pixel, in accordance with one or more embodiments.
Figure 14B:
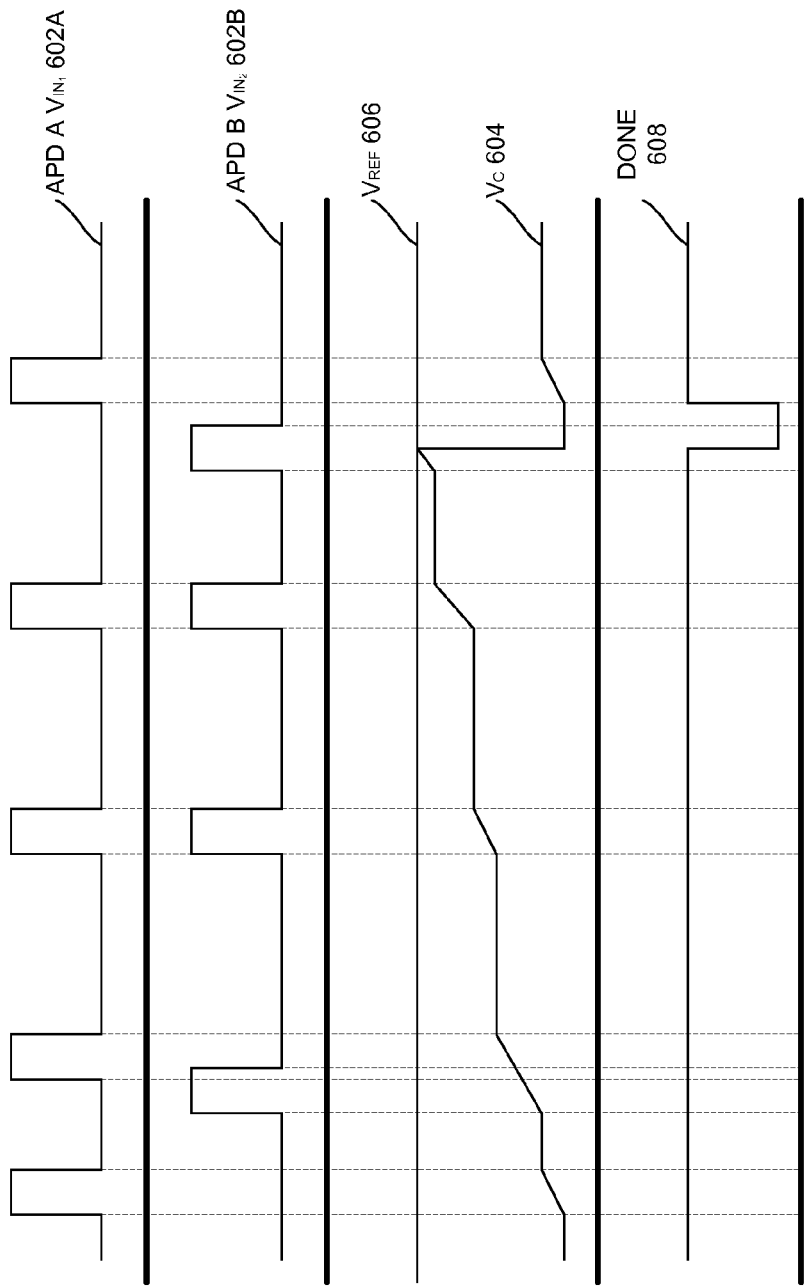
FIG. 14B illustrates a waveform obtained through simulation of operation of intensity measurement circuit of FIG. 14A, in accordance with one or more embodiments.

FIG. 14A illustrates an intensity measurement circuit 508C with multiple photodiodes per pixel, in accordance with one or more embodiments. In one or more embodiments, the intensity measurement circuit 508C of FIG. 14A includes a pair of current sources, 512 A and 512 B, coupled to a pair of photodiodes APD A and APD B respectively. With every additional photodiode added into the pixel, an additional current source may be coupled to the additional photodiode. The counting of both APDA and APDB may be performed in parallel through the intensity measurement circuit. FIG. 14B illustrates a waveform obtained through simulation of operation of intensity measurement circuit 508C of FIG. 14A. As illustrated in FIG. 14B, when both the APD A and APD B generate a digital pulse simultaneously or in sequence, then the capacitor $C_H$ 516 gets charged and the voltage $V_C$ may be incremented in steps as a result of the currents generated by the current sources 512A and 512 B. The voltage $V_C$ may increment in steps to a value indicative of the number of photons received by either/or both of APD A and APD B. So the number of photons received by either of the APD A and APD B may be counted simultaneously through the comparator 520 by setting voltage Vref to a suitable value based on the application of the intensity measurement circuit 508C. When the voltage $V_C$ is equal to Vref, the done 608 signal may go low and the capacitor $C_H$ 516 may discharge through the first reset transistor M1. The intensity measurement circuit 508C may be reset through the second reset transistor M2, before the capturing the next frame of an image, by providing an external signal 616.

Figure 15A:
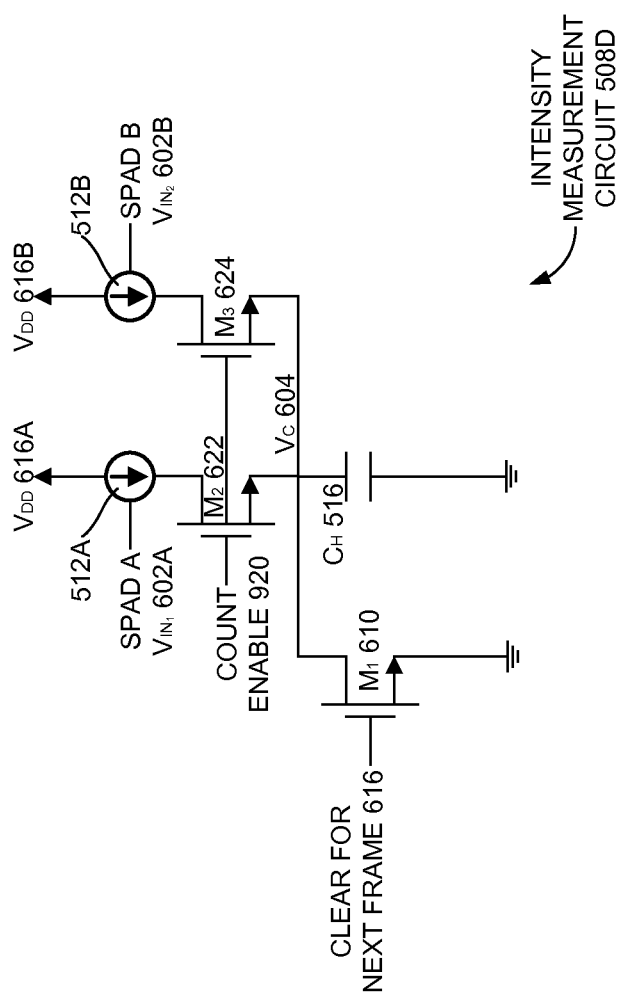
FIG. 15A illustrates an intensity measurement circuit, in accordance with another embodiment.

FIG. 15A illustrates an intensity measurement circuit 508D, in accordance with another embodiment. In the above mentioned embodiment, the intensity measurement circuit 508D may include multiple photodiodes per pixel and an intensity measurement circuit 508D enabling and/or disabling mechanism implemented therein. In one or more embodiments, the intensity measurement circuit 508D illustrated in FIG. 15A includes a pair of single photon avalanche photodiodes SPAD A and SPAD B coupled to a pair of current sources 512A and 512 B respectively. The current sources 512 A and 512B may be electrically coupled to a capacitor $C_H$ 516 through a pair of transistors M2 and M3 respectively. The transistors may be enabled or disabled through a count enable 920 from an external circuit. When enabled, the transistors M2 and M3 may allow the current generated by the current sources 512A and 512B to charge the capacitor $C_H$ 516.

The charging of the capacitor $C_H$ may enable the counting of a number of photons received by SPAD A and SPAD B through the intensity measurement circuit 508D. When the count enable 920 signal is low, both the transistors M2 and M3 may be disabled. When the transistors M2 and M3 are disabled, the counting of the number of photons received by SPAD A and SPAD B through the intensity measurement circuit 508D may be disabled. The capacitor $C_H$ 516 may increment in steps to voltage $V_C$ on receiving current from either or both of the current sources 512A and 512B due to a cumulative effect of the current received therein. The voltage $V_C$ may be fed to a comparator 520 as in the intensity measurement circuit 508 illustrated in FIG. 5 to count the number of photons received by either of SPAD A and SPAD B. The counting may be performed simultaneously for both the SPAD A and SPAD B photodiodes. In one or more embodiments, multiple SPADS and multiple current sources may be implemented in the intensity measurement circuit 508D. The increase in number of SPADs per pixel reduces the deadtime of the pixel.

Figure 15B:
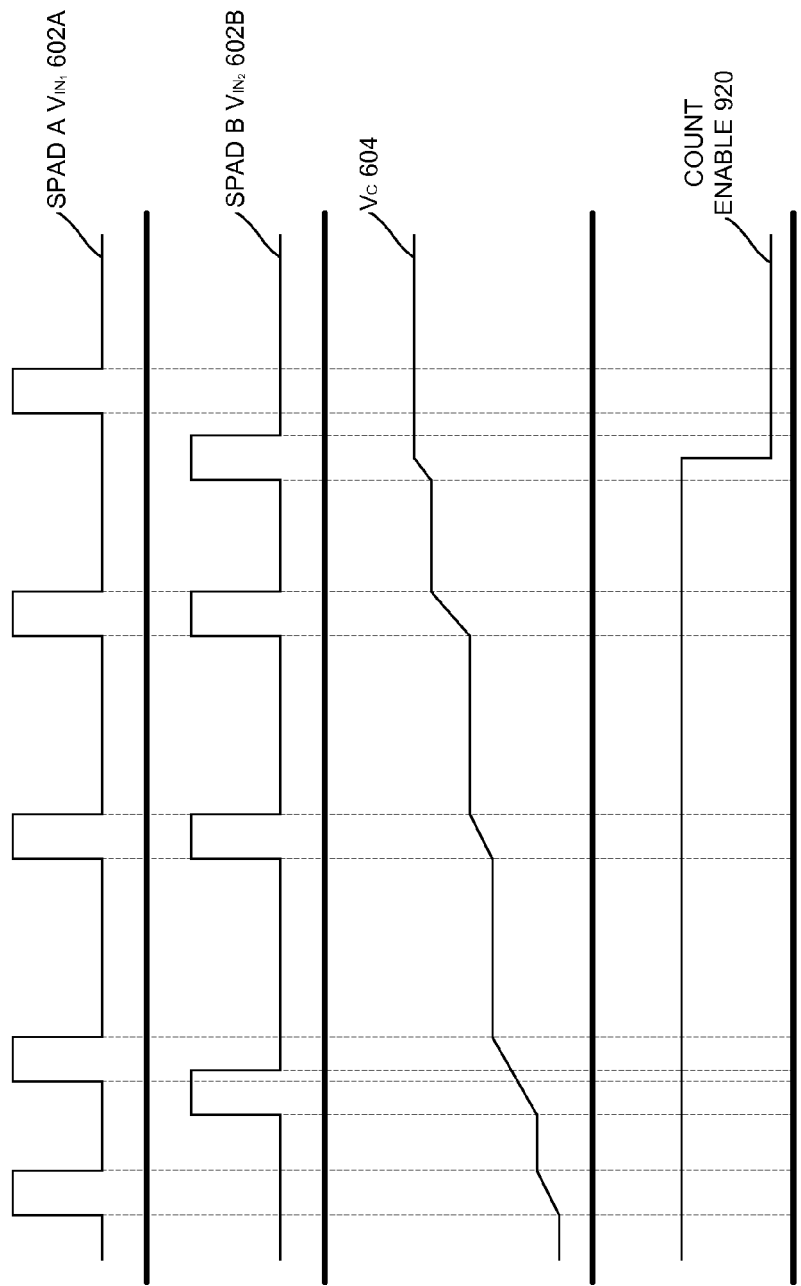
FIG. 15B illustrates various waveforms obtained through simulation of operation of the intensity measurement circuit of FIG. 15A, in accordance with one or more embodiments.

FIG. 15B illustrates various waveforms obtained through simulation of operation of the intensity measurement circuit 508D of FIG. 15A. In one or more embodiments, as illustrated in FIG. 15B, when count enable 520 signal is high (logic 1) and when the digital pulses Vin1 and Vin 2 are generated simultaneously or in sequence by SPAD A and SPAD B respectively, then the capacitor $C_H$ 516 gets charged and the voltage $V_C$ may increment in steps as a result of the currents generated by the current sources 512A and 512B. The voltage $V_C$ may increment in steps to a value indicative of the number of photons received by either/or both of SPAD A and SPAD B. So the number of photons received by either of the SPAD A and SPAD B may be counted simultaneously through the comparator 520 by setting voltage Vref to a suitable value based on the application of the intensity measurement circuit 508D.

When count enable is high (logic 1), the voltage $V_C$ may increment in steps as an effect of every photon received at either SPAD A or SPAD B. When the count enable goes low, the voltage $V_C$ remains constant irrespective of digital pulses received at SPAD A and/or SPAD B, and so the intensity measurement circuit remain disabled when count enable 920 is low. The intensity measurement circuit 508D illustrated in FIG. 15A allows enabling and/or disabling the process of counting the number of photons received the photodiodes based on requirements of an application of the intensity measurement circuit 508D of FIG. 15A.

Figure 16:
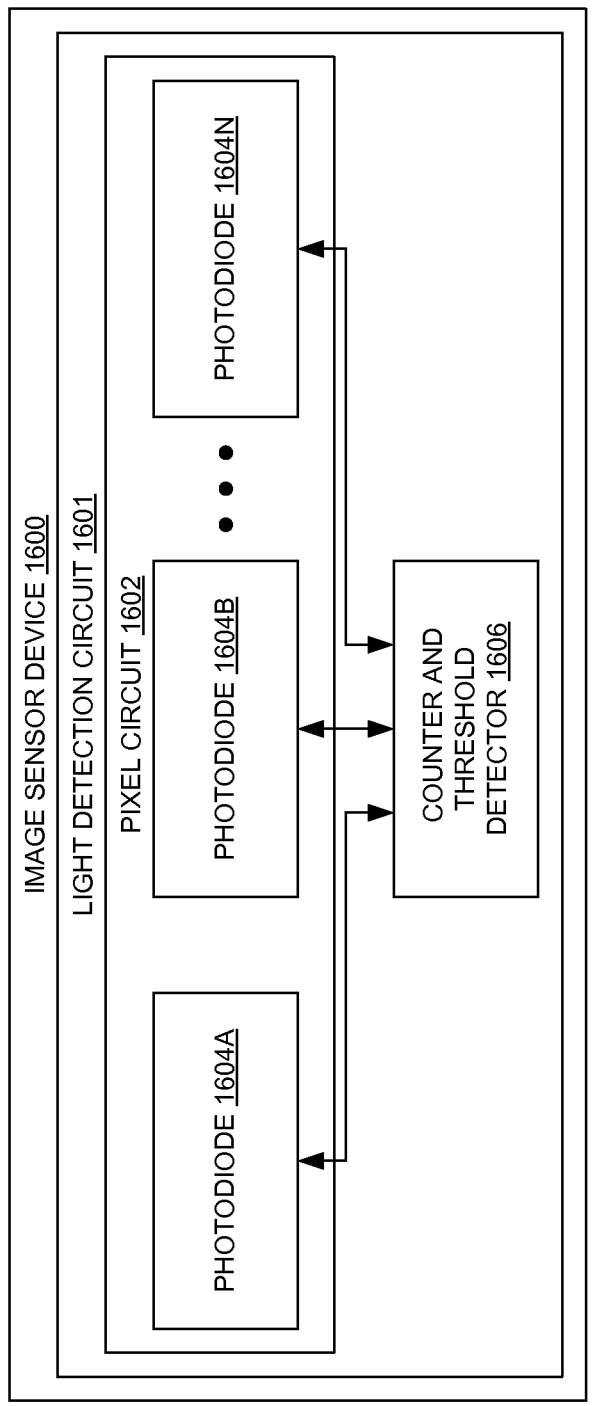
FIG. 16 is a block diagram of an image sensor device including a light detection circuit and multiple photodiodes configured to perform coordinated in-pixel light detection, in accordance with one or more embodiments.

FIG. 16 is a block diagram of an image sensor device 1600 including a light detection circuit 1601 and multiple photodiodes configured to perform coordinated in-pixel light detection, in accordance with one or more embodiments. In one or more embodiments, the image sensor device 1600 may be analogous to the image sensor device 200 and image sensor device 502. However, the image sensor 1600 may emphasize on a different aspect of measurement of light intensity compared to image sensor device 200 and image sensor device 502. In one or more embodiments, the light detection circuit 1601 may also be configured to measure intensity of light. In one or more embodiments, the light detection circuit 1601 may include a pixel circuit 1602 including a number of photodiodes (e.g. photodiode 1604A-1604N) configured to detect light. Examples of the photodiodes may include, but are not limited to avalanche photo diodes, single photon avalanche photodiodes and the like. The photodiodes inside the pixel circuit 1602 may detect one or more photons of the light incident on the photodiodes. On detecting each of the photons, the photodiodes may generate a digital pulse. In one or more embodiments, the light detection circuit 1601 may also include a counter circuit (e.g., an analog counter and threshold detector 1606) to count the number of photons detected through the photodiodes. In one or more embodiments, the counter and threshold detector 1606 may be analogous to the intensity measurement circuit 508 in FIG. 5 when the counter and threshold detector 1606 may be implemented inside the pixel circuit 1602. The counter circuit may count the number of photons detected through different photodiodes simultaneously, in parallel. The counter circuit may operate in a digital state or an analog state.

The counter circuit may be implemented outside the pixel circuit 1602 when the counter circuit operates in the digital state. The counter circuit may be a combination of flip flops and a combinational logic circuit when the counter circuit operates in the digital state. In one or more embodiments, a threshold detector may be coupled to an output of the counter circuit to determine a count of the number of photons incident on the photodiodes when the counter circuit operates in the analog state. Multiple photodiodes may be implemented inside the pixel circuit 1602 to increase a photon counting rate of the light detection circuit 1601 as the counter circuit allows parallel counting of the photons detected through different photodiodes inside the pixel circuit 1602. Also, implementing 'N' photodiodes inside the pixel circuit 1602 reduces a deadtime of the light detection circuit 1601 by a factor of 'N'. The photon counting rate of the light detection circuit 1601 may increase with the reduction in the deadtime. In one or more embodiments, the light detection circuit 1601 may be implemented in a deep submicron semiconductor technology.

In one or more embodiments, a current source may be coupled between each of the 'N' photodiodes and the counter circuit when the counter circuit operates in the analog state. The current source may be coupled such that an input of each of the current source is coupled with each photodiode and an output of each of the current source is coupled with the counter circuit. In addition, in one or more embodiments, the N-number of photodiodes may be in a common well of a semiconductor technology (e.g., deep submicron semiconductor technology) to increase a fill factor of the pixel circuit 1602. The fill factor of the pixel circuit 1602 may be an area occupied by an active area of the photodiode as compared to a combined circuit layout area of the photodiode and a remaining circuit of the pixel circuit 1602.

Figure 17A:
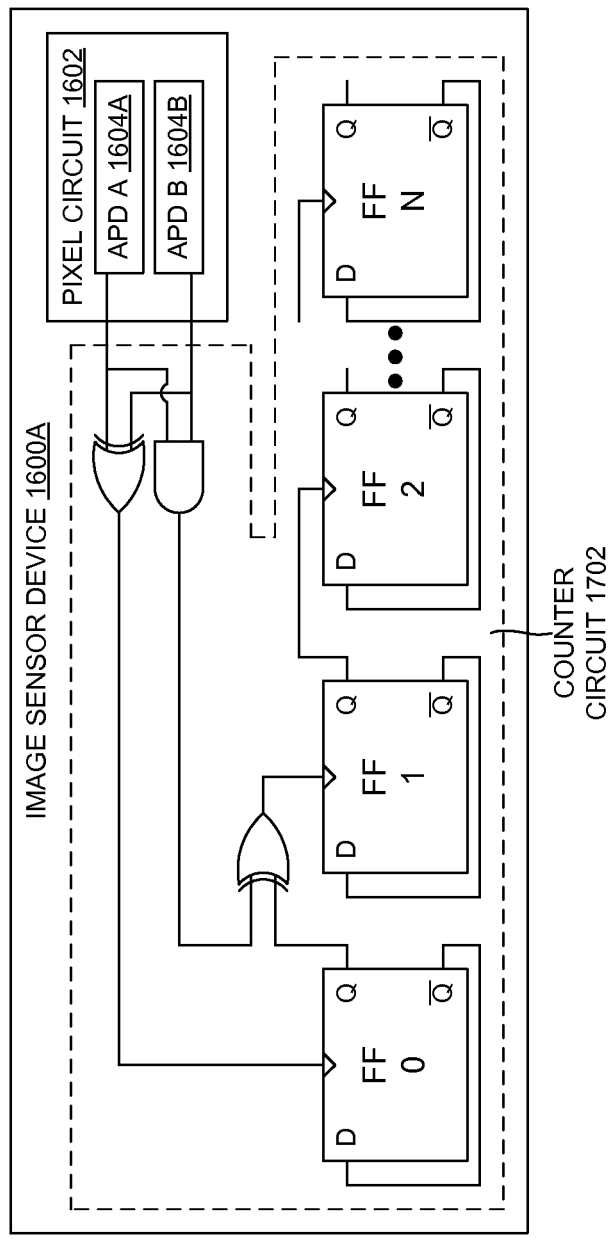
FIG. 17A illustrates an image sensor device with a counter circuit operable in a digital state, in accordance with one or more embodiments.

FIG. 17A illustrates an image sensor device 1600 A with a counter circuit 1702 operable in a digital state, in accordance with one or more embodiments. The counter circuit 1702 illustrated in FIG. 17A includes n number of flip flops connected in series forming an N-bit digital counter. N may be an integer greater than 0. The pixel circuit 1602 of the image sensor device 1600 A may include a pair of avalanche photodiodes (e.g., APD A 1604A and APD B 1604B). The avalanche photodiodes may be coupled to the counter circuit 1702 through a selection logic including one or more logic gates as illustrated in FIG. 17A. The counter circuit 1702 may count number of photons detected through the avalanche photodiodes simultaneously/or in parallel. A first flip flop from among the flip flops may be activated when either of the APD A or APD B detects a photon. A second flip flop from among the flip flops may be activated through the output of the first flip flop and when both the APD A and APD B simultaneously generate a digital pulse on detecting subsequent photons. A third flip flop may be activated through the output of the second flip flop. Similarly, each of the subsequent flip flops may be activated through output of a preceding flip flop from among the flip flops of the counter circuit 1702. The photons detected through either of the APD A and APD B may thereby be detected simultaneously through the counter circuit 1702. In one or more embodiments, multiple photodiodes may be implemented in a common well.

Figure 17B:
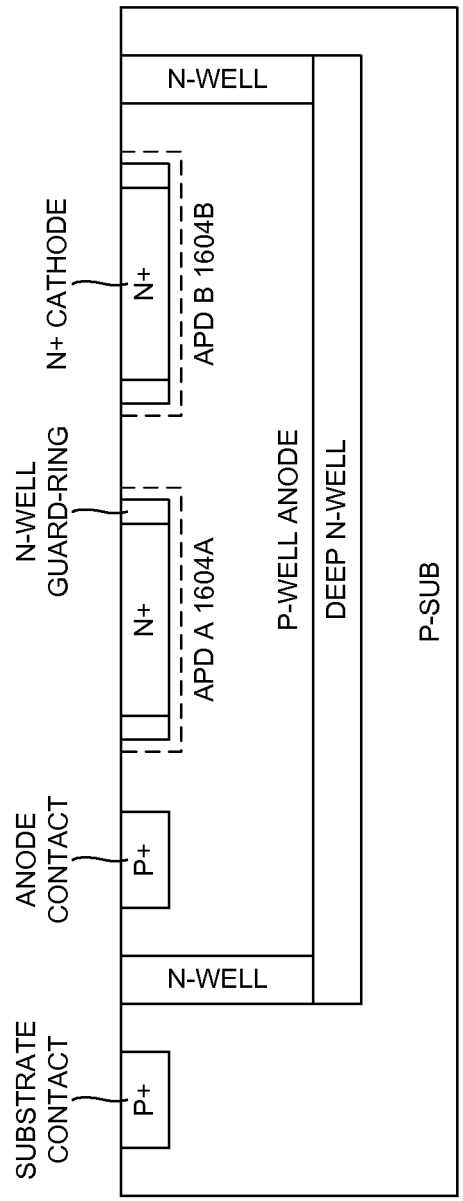
FIG. 17B illustrates a layout cross section of a pair of avalanche photodiodes implemented in a common well of a semiconductor technology, in accordance with one or more embodiments.
Figure 18A:
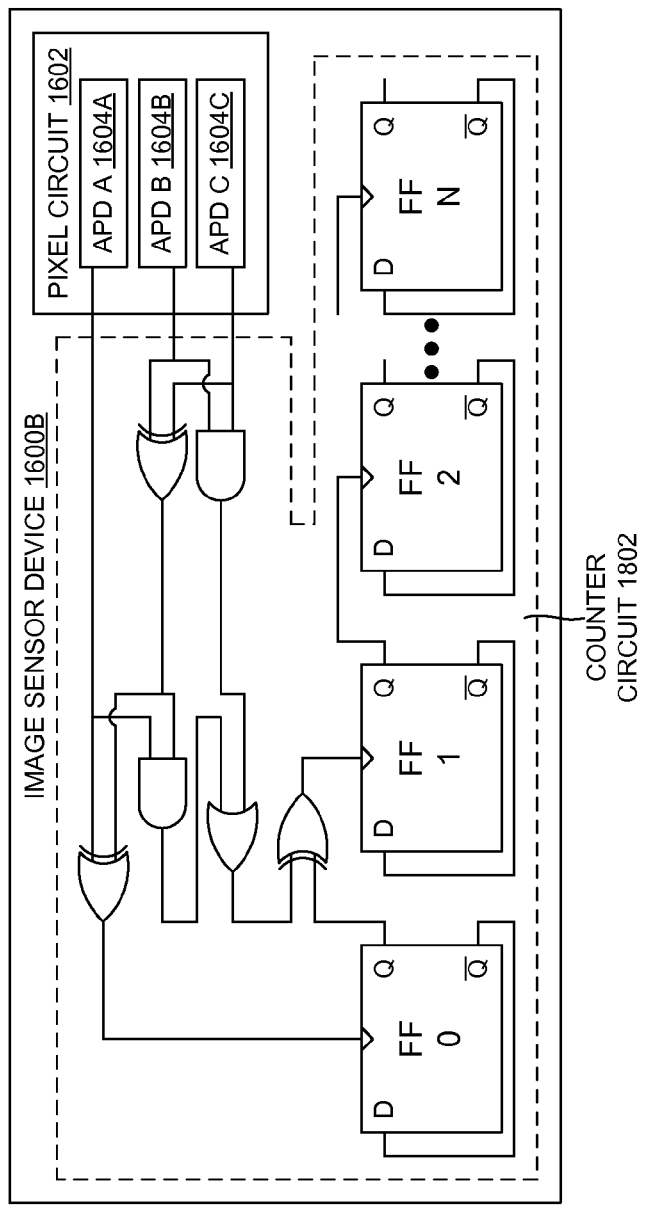
FIG. 18A illustrates another embodiment of an image sensor device with a counter circuit operating in a digital state, in accordance with one or more embodiments.

FIG. 17B illustrates a layout cross section of a pair of avalanche photodiodes implemented in a common well of a semiconductor technology (e.g., deep submicron semiconductor technology), in accordance with one or more embodiments. In one or more embodiments, the fill factor of the pixel circuit 1602 may be improved through the implementation of multiple avalanche photodiodes in the common well. The fill factor of the pixel circuit 1602 may be an area occupied by an active area of the photodiode as compared to a combined circuit layout area of the photodiode and a remaining circuit of the pixel circuit 1602. Counting of both APD A and APD B may be done simultaneously through the counter circuit 1702 illustrated in FIG. 17A, FIG. 18A illustrates another embodiment of an image sensor device 1600 B with a counter circuit 1802 operating in a digital state. The image sensor device 1600 B illustrated in FIG. 18A includes three avalanche photodiodes (e.g. APD A 1604 A, APD B, 1604B, and APD C 1604C). The image sensor device 100 B also includes the counter circuit 1802 coupled to the avalanche photo diodes through a selection logic including one or more logic gates as illustrated in FIG. 18A. The counter circuit 1802 may include N flip flops connected in series forming an N bit digital counter. N may be an integer greater than 0. A first flip flop from among the flip flops may be activated when any of the avalanche photodiodes detects a photon and generates a digital pulse. A second flip flop may be activated through an output of the first flip flop and when subsequent photons are detected through the avalanche photodiodes. Each of the subsequent flip flops may be activated through the output of the preceding flip flops as indicated in FIG. 18A to perform N bit counting. The photons detected through either of the APD A, APD B, or APD C may thereby be detected simultaneously through the counter circuit 1802.

Figure 18B:
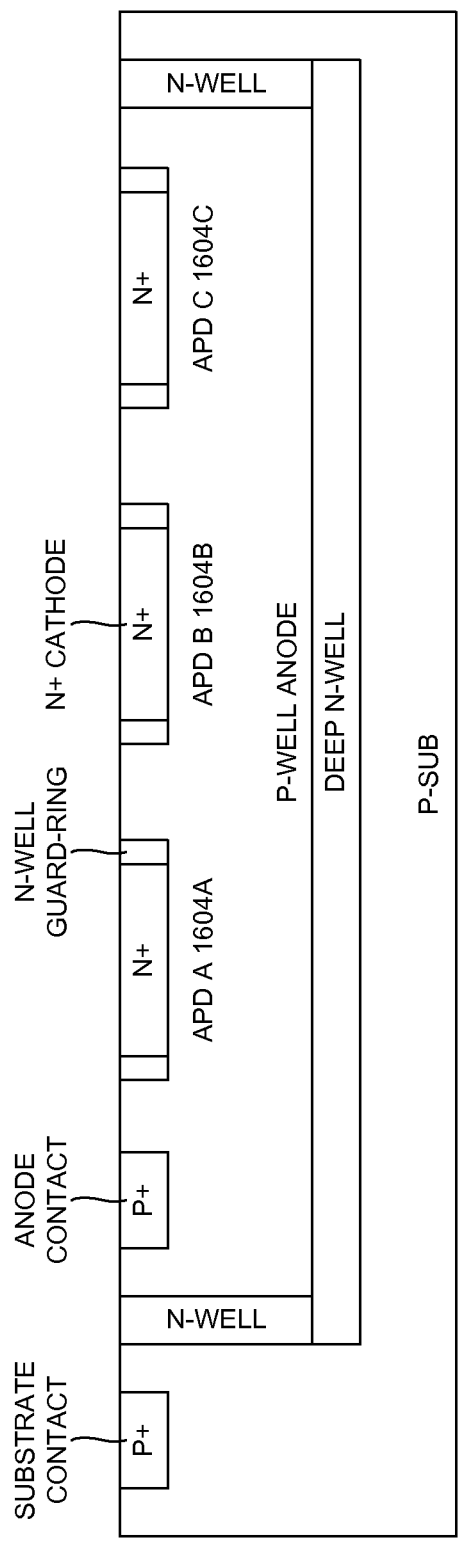
FIG. 18B illustrates a layout cross section of three avalanche photodiodes implemented in a common well of a semiconductor technology, in accordance with one or more embodiments.
Figure 19A:
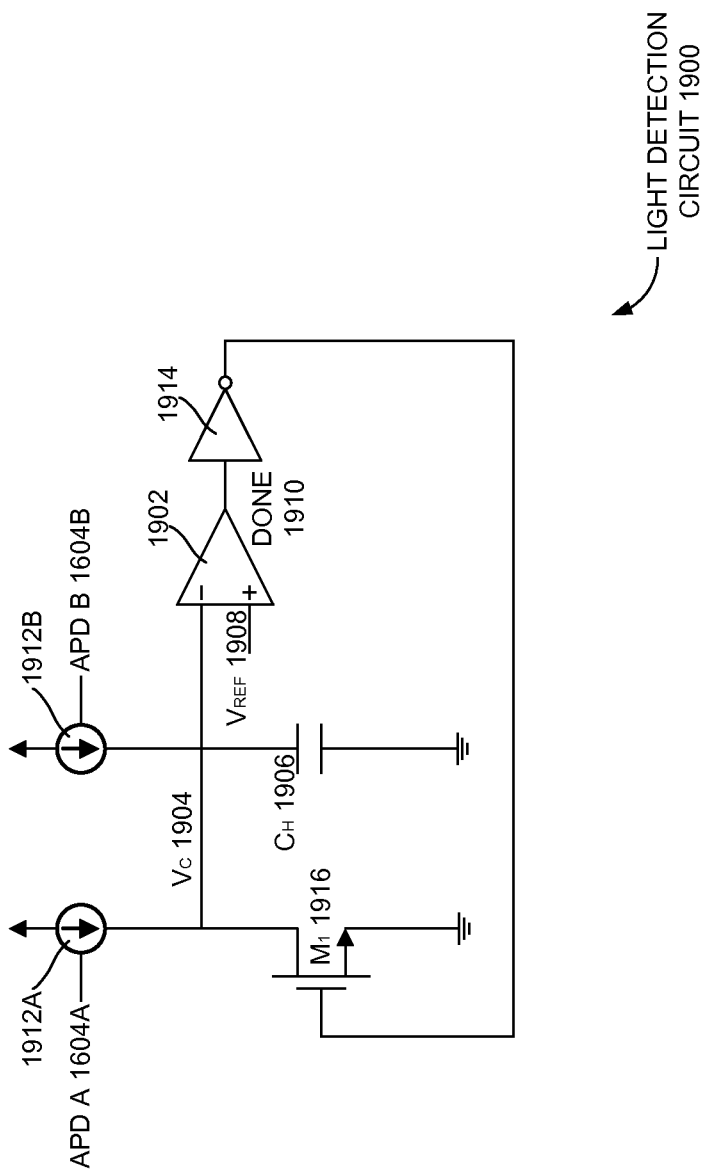
FIG. 19A illustrates a light detection circuit with a pair of photodiodes, in accordance with one or more embodiments.

FIG. 18B illustrates a layout cross section of three avalanche photodiodes implemented in a common well of a semiconductor technology (e.g., deep submicron semiconductor technology), in accordance with one or more embodiments. The implementation in the common well may cause increase in a fill factor of the pixel circuit 1602. The fill factor of the pixel circuit 1602 may be an area occupied by an active area of the photodiode as compared to a combined circuit layout area of the photodiode and a remaining circuit of the pixel circuit 1602. Counting of the photons detected through all the three APDs, APD A, APD B, and APD C may be done simultaneously through the counter circuit 1802 illustrated in FIG. 18A, FIG. 19A illustrates a light detection circuit 1900 with a pair of photodiodes (e.g. APD A 1604A and APD B 1604 B), in accordance with one or more embodiments. In one or more embodiments, light detection circuit 1900 of FIG. 19A may include a pair of current sources (e.g., 1912 A and 1912 B), coupled to the photodiodes APD A 1604 A and APD B 1604 B respectively. With every additional photodiode added into the pixel, an additional current source may be coupled to the additional photodiode. Examples of the current sources may include, but is not limited to, voltage controlled current sources. In one or more embodiments, the light detection circuit 1900 may also include a capacitor $C_H$ 1906 electrically coupled to the current sources to accumulate an electric charge proportional to the currents generated through the current sources. In one or more embodiments, the light detection circuit 1900 may further include a comparator 1902.

The comparator 1902 may be electrically coupled to the capacitor $C_H$ 1906 to receive an output voltage $V_C$ 1904 of the capacitor $C_H$ 1906. Example of the comparator 1902 may include, but is not limited to an operational amplifier. The comparator 1902 may be configured to compare the output voltage $V_C$ 1904 of the capacitor $C_H$ 1906 to a reference voltage Vref. In one or more embodiments, the reference voltage Vref may correspond to a threshold number of counts of the photons incident on the photodiodes (e.g. APD A and APD B). In one or more embodiments, the reference voltage Vref may be determined based on an application of the light detection circuit 1900. An output terminal of the comparator 1902 may be coupled to a reset transistor M1 1916 through a logic gate (e.g. Not gate 1914) to activate the reset transistor M1 1916. The activation of reset transistor M1 1916 the may cause the capacitor $C_H$ 1906 to discharge through the activated reset transistor M1 1916.

Each of the photodiodes APD A and APD B may generate a digital pulse on detecting a photon. In one or more embodiments, the generated digital pulses by the photodiodes may activate the current sources 1912 A and 1912 B. The current sources 1912 A and 1912 B may generate currents on activation. In one or more embodiments, a predetermined amount of the electric charge proportional to the currents generated by the current sources 1912 A and 1912 B may be delivered to the capacitor $C_H$ 1906 of the light detection circuit 1900 on activation of the current sources. The capacitor $C_H$ 1906 may get charged through the predetermined amount of the electric charge. In one or more embodiments, the output voltage $V_C$ of the capacitor 1906 may increment in steps proportional to the predetermined amount of the electric charge accumulated in the capacitor 1906. When the output voltage $V_C$ of the capacitor 1906 reaches the reference voltage Vref of the comparator 1902, a low done signal 1910 (logic 0) may be generated at the output of the comparator 1902. The low done signal 1910 may be negated through a logic gate (e.g., Not gate 1914) to obtain a high reset signal (logic 1). The high reset signal may be used to activate the reset transistor M1 1916. The capacitor 1906 may discharge through the reset transistor M1 on activation of the reset transistor M1. The counting of photons detected through both APDA 1604 A and APDB 1604 B may be performed in parallel through the light detection circuit 1900.

Figure 19B:
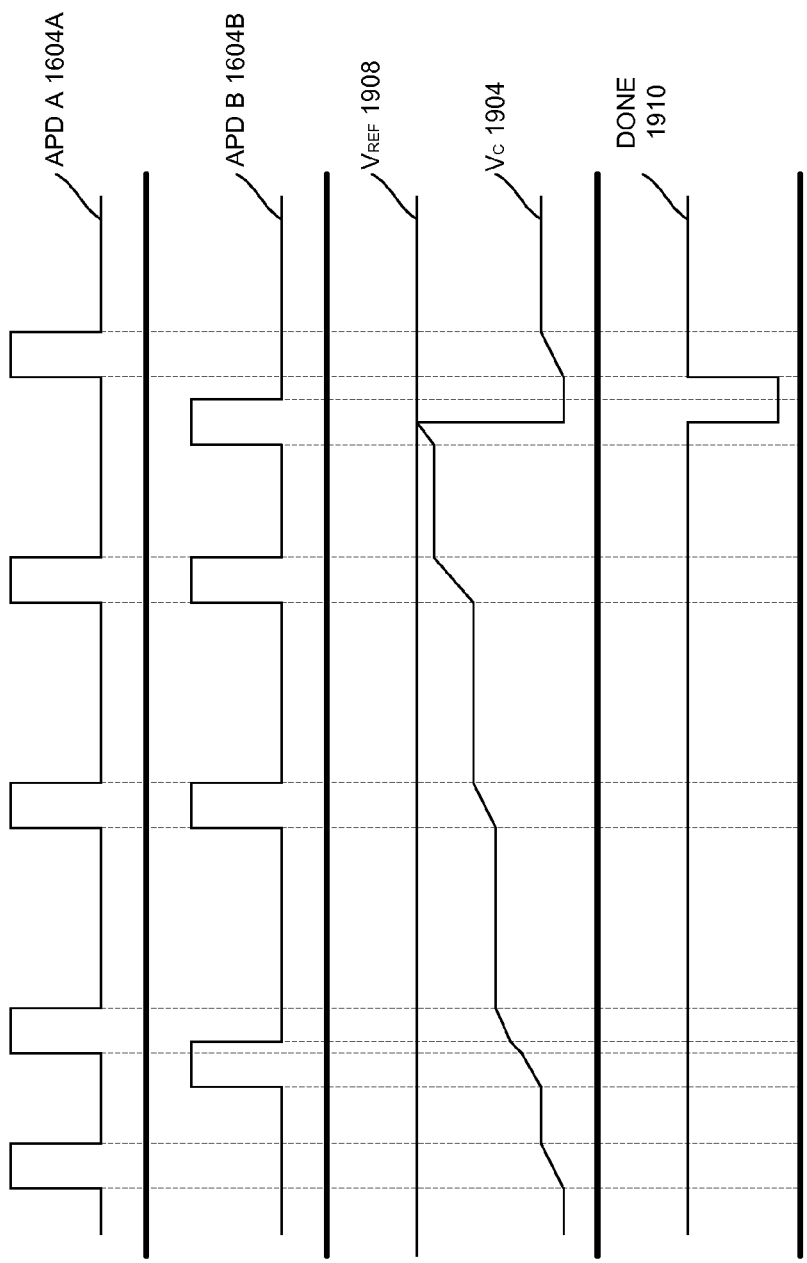
FIG. 19B illustrates a waveform obtained through simulation of operation of the light detection circuit of FIG. 19A, in accordance with one or more embodiments.

FIG. 19B illustrates a waveform obtained through simulation of operation of the light detection circuit 1900 of FIG. 19A, in accordance with one or more embodiments. As illustrated in FIG. 19B, when both the APD A and APD B generate a digital pulse simultaneously or in sequence, then the capacitor $C_H$ 1906 gets charged to the output voltage $V_C$. The output voltage $V_C$ may be incremented in steps as a result of the currents generated by the current sources 1912A and 1912 B. The output voltage $V_C$ may increment in steps to a value indicative of the number of photons received by either/or both of APD A and APD B. The number of photons received by either of the APD A and APD B may be counted simultaneously through the comparator 120 by setting voltage Vref to a suitable value based on the application of the light detection circuit 1900. When the voltage $V_C$ 1904 is equal to Vref 1908 the done 1910 signal may go low as illustrated in FIG. 19B and the capacitor $C_H$ 1906 may discharge through the reset transistor M1. As the capacitor discharges, the output voltage $V_C$ of the capacitor $C_H$ 1906 goes low as illustrated in FIG. 19B. When a subsequent digital pulse is generated through APD A 1604 A, as illustrated in FIG. 19B, the capacitor $C_H$ 1906 may begin to get charged again and the output voltage Vc may increment through a step. Also, the done signal 1910 may go high when the digital pulse is generated through the APD A 1604 A on receiving the subsequent photon as illustrated in FIG. 19B.

Figure 20:
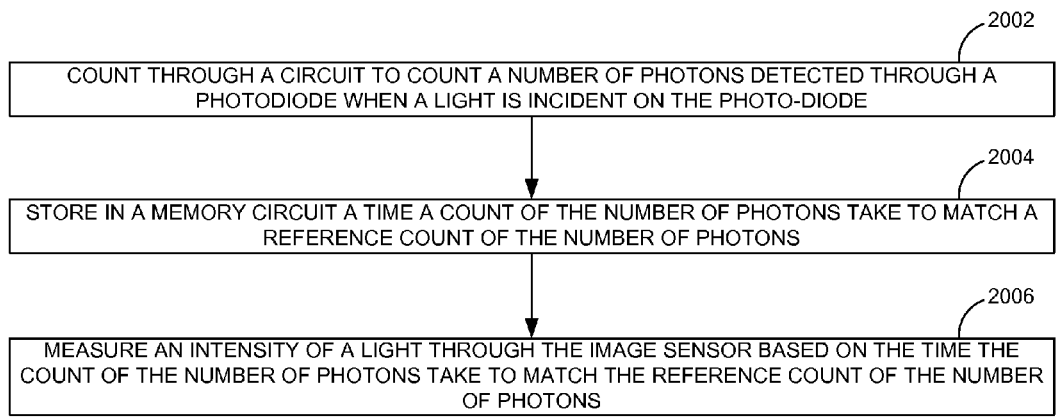
FIG. 20 is a process flow illustrating a method of single photon counting through an image sensor device, in accordance with one or more embodiments.

FIG. 20 is a process flow illustrating a method of single photon counting through an image sensor device, in accordance with one or more embodiments. In one or more embodiments, operation 2002 may involve, counting through a counter circuit, a number of photons detected through a photodiode when a light is incident on the photodiode. In one or more embodiments, operation 2004 may involve storing in a memory circuit, a time taken by a count of the number of photons to match a reference count of the number of photons. In one or more embodiments, operation 2006 may involve measuring an intensity of a light through the image sensor based on the time taken by the count of the number of photons to match the reference count of the number of photons.

In one or more embodiments, a comparator circuit of the counter circuit may determine when a count of the number of photons detected matches the reference count of the number of photons. In one or more embodiments, the reference count of number of photons may be selected through a threshold selection circuit. In one or more embodiments, the reference count of number of photons may be changed dynamically based on an output of the threshold selection circuit through controlling a threshold multiplexer circuit to increase at least one of a dynamic range of the image sensor and a speed of operation of the image sensor. T In one or more embodiments, the image sensor may be implemented in a deep submicron semiconductor technology.

In one or more embodiments, a dynamic range of the image sensor, a sensitivity of the image sensor and/or a speed of operation of the image sensor may be increased through measuring the intensity of light based on the time the count of the number of photons take to match the reference count of the number of photons. In one or more embodiments, the counter circuit may be internal to a pixel circuit of the image sensor to maximize the speed of operation of the image sensor. In one or more embodiments, the memory circuit may be an n-bit volatile memory. In one or more embodiments, 'n' may be determined based on an application of the image sensor, and the output of the image sensor may be an image.

In one or more embodiments, the photodiode may be an avalanche photodiode, a single photon avalanche photodiode, and the like. In one or more embodiments, the avalanche photodiode may operate in a Geiger mode. In one or more embodiments, the avalanche photodiode may be coupled to a low dead time active quench and reset circuit. In one or more embodiments, a count of time stored in the memory circuit may be provided through a clock circuit. In one or more embodiments, a clock circuit may be a separate counter circuit from the counter circuit inside the pixel. The separate counter circuit may be external to the pixel circuit and is triggered through an external clock signal.

In one or more embodiments, a speed of operation of the image sensor may be increased through counting the number of photons detected through the photodiode inside the pixel circuit of the image sensor. Further, a high dynamic range and high sensitivity output may be generated at a high speed of operation in a single capture operation of the image sensor through measuring the intensity of light based on the time the count of the number of incident photons take to reach the reference count of the number of photons.

In one or more embodiments, the image sensor may be operated at high frame rate of the image sensor while maintaining a high dynamic range through increasing a pixel rate of the image sensor. In one or more embodiments, a time taken to measure a low intensity light incident on the photodiode may be reduced through changing the reference count of number of photons dynamically. In one or more embodiments, a count of the number of photons detected through the counter circuit may be stopped when a maximum threshold time is reached if the maximum threshold time is reached before all the pixel circuit of the image sensor has finished storing in the memory circuit the time the count of the number of photons take to match the reference count of the number of photons.

Although the present embodiments have been described with reference to specific example embodiments, it will be evident that various modifications and changes may be made to these embodiments without departing from the broader spirit and scope of the various embodiments. For example, the various devices, circuits, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

We claim:

1. A method of an image sensor, comprising:
   counting through a counter circuit a number of photons detected through a photodiode of a pixel of an imaging array of the image sensor when a light is incident on the photodiode;
   storing in a memory circuit a time that a count of the number of photons take to match a reference count of the number of photons; and
   measuring an intensity of the light through the image sensor based on the time that the count of the number of photons take to match the reference count of the number of photons.

2. The method of claim 1, further comprising:
   determining through a comparator circuit of the counter circuit when a count of the number of photons detected matches the reference count of the number of photons;
   selecting the reference count of number of photons through a threshold selection circuit;
   changing the reference count of number of photons dynamically based on an output of the threshold selection circuit through controlling a threshold multiplexer circuit to increase at least one of a dynamic range of the image sensor and a speed of operation of the image sensor; and
   implementing the image sensor in a deep submicron semiconductor technology.

3. The method of claim 1, further comprising:
   increasing at least one of a dynamic range of the image sensor, a sensitivity of the image sensor and a speed of operation of the image sensor through measuring the intensity of light based on the time that the count of the number of photons take to match the reference count of the number of photons.

4. The method of claim 1:
   wherein the counter circuit is internal to a pixel circuit of the image sensor to maximize the speed of operation of the image sensor,
   wherein the memory circuit is an n-bit volatile memory,
   wherein 'n' is determined based on an application of the image sensor, and
   wherein the output of the image sensor is an image.

5. The method of claim 1:
   wherein the photodiode is an avalanche photodiode, and
   wherein the avalanche photodiode operates in a Geiger mode
   wherein the avalanche photodiode is coupled to a low dead time active quench and reset circuit.

6. The method of claim 1:
   wherein a count of time stored in the memory circuit is provided through a clock circuit,
   wherein the clock circuit is a separate counter circuit from the counter circuit inside the pixel, and
   wherein the separate counter circuit is external to the pixel circuit and is triggered through an external clock signal.

7. The method of claim 4, further comprising:
   enhancing a speed of operation of the image sensor through counting the number of photons detected through a photodiode inside the pixel circuit of the image sensor;
   generating a high dynamic range and high sensitivity output at a high speed of operation in a single capture operation of the image sensor through measuring the intensity of light based on the time that the count of the number of incident photons take to reach the reference count of the number of photons.

8. The method of claim 1, further comprising:
operating the image sensor at high frame rate of the image sensor while maintaining a high dynamic range through increasing a pixel rate of the image sensor,
reducing a time taken to measure a low intensity light incident on the photodiode through changing the reference count of number of photons dynamically.

9. The method of claim 1, further comprising:
stopping a count of the number of photons detected through the counter circuit when a maximum threshold time is reached if the maximum threshold time is reached before all the pixel circuit of the image sensor has finished storing in the memory circuit the time that the count of the number of photons take to match the reference count of the number of photons.

10. An image sensor device, comprising:
a pixel circuit of an imaging array of pixel circuits;
a photodiode circuit of the pixel circuit to detect photons when a light is incident on the photodiode circuit, wherein the photodiode circuit comprises an avalanche photodiode;
a counter circuit of the pixel circuit coupled to the photodiode circuit to count a number of photons detected when the light is incident on the avalanche photodiode;
a memory circuit of the pixel circuit coupled to the counter circuit to store a time that a count of the number of photons take to match a reference count of the number of photons; and
a threshold multiplexer circuit of the pixel circuit to change the reference count of number of photons dynamically based on an output of a threshold selection circuit.

11. The device of claim 10, further comprising:
a comparator circuit of the counter circuit to determine when, a count of the number of photons detected matches the reference count of the number of photons; and
a timer circuit of the image sensor device to provide a count of time to the memory circuit proportional to the time that the count of the number of photons detected takes to match a reference count of number of photons.

12. The device of claim 10:
wherein the photodiode circuit, the counter circuit and the memory circuit are internal to the pixel circuit, and
wherein the photodiode circuit, the counter circuit and the memory circuit operate in concert to generate a high dynamic range and high sensitivity output at a high speed of operation in a single capture operation of the image sensor device through measuring an intensity of light based on the time that the count of the number of photons take to match the reference count of the number of photons.

13. The device of claim 10:
wherein the threshold selection circuit is utilized to select a reference count of number of photons,
wherein the timer circuit is a separate counter circuit,
wherein the separate counter circuit is external to the pixel circuit,
wherein the separate counter circuit is triggered through an external clock signal, and
wherein the timer circuit is utilized to provide the count of time to each pixel circuit in a pixel circuit array of the image sensor device.

14. A camera on chip system, comprising:
an image source;
an array of pixel circuits to capture an image of the image source;
a photodiode circuit inside each pixel circuit of the array of pixel circuit to detect photons when a light is incident on the photodiode circuit, wherein the photodiode circuit comprises an avalanche photodiode;
a counter circuit of each pixel circuit of the array of pixel circuit, coupled to the photodiode circuit to count a number of photons detected when the light is incident on the avalanche photo diode;
a memory circuit of each pixel circuit of the array of pixel circuit, coupled to the counter circuit to store a time that a count of the number of photons take to match a reference count of the number of photons.

15. The camera on chip system of claim 14, further comprising:
a threshold multiplexer circuit of each pixel circuit of the array of pixel circuit to change the reference count of number of photons dynamically based on an output of a threshold selection circuit;
a comparator circuit of the counter circuit to determine when, a count of the number of photons detected matches the reference count of the number of photons; and
a timer circuit of the camera on chip system to provide a count of time to the memory circuit proportional to the time that the count of the number of photons detected takes to match a reference count of number of photons.

16. The camera on chip system of claim 14:
wherein the photodiode circuit, the counter circuit and the memory circuit are internal to the pixel circuit, and
wherein the photodiode circuit, the counter circuit and the memory circuit operate in concert to generate a high dynamic range and high sensitivity output at a high speed of operation in a single capture operation of the image sensor device through measuring an intensity of light based on the time that the count of the number of photons take to match the reference count of the number of photons.

17. The camera on chip system of claim 15:
wherein the threshold selection circuit is utilized to select a reference count of number of photons, and
wherein the timer circuit is a separate counter circuit.

18. The camera on chip system of claim 17:
wherein the separate counter circuit is external to the pixel circuit,
wherein the separate counter circuit is triggered through an external clock signal, and
wherein the timer circuit is utilized to provide the count of time to each pixel circuit in a pixel circuit array of the image sensor device.

19. The camera on chip system of claim 14:
wherein the counter circuit is internal to a pixel circuit of the image sensor to maximize the speed of operation of the image sensor,
wherein the memory circuit comprises an n-bit volatile memory, and
wherein 'n' is determined based on an application of the camera on chip system.

20. The camera on chip system of claim 14:
and
wherein the avalanche photodiode operates in a Geiger mode
wherein the avalanche photodiode is coupled to a low dead time active quench and reset circuit.

* * * * *